(12) United States Patent
Yamazaki et al.

(10) Patent No.: US 7,795,616 B2
(45) Date of Patent: Sep. 14, 2010

(54) LIQUID CRYSTAL DISPLAY DEVICE AND METHOD FOR MANUFACTURING THE SAME

(75) Inventors: Shunpei Yamazaki, Tokyo (JP); Shinji Maekawa, Shizuoka (JP); Gen Fujii, Kanagawa (JP); Hideaki Kuwabara, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/576,420

(22) PCT Filed: Nov. 5, 2004

(86) PCT No.: PCT/JP2004/016795
§ 371 (c)(1),
(2), (4) Date: Apr. 19, 2006

(87) PCT Pub. No.: WO2005/047967
PCT Pub. Date: May 26, 2005

(65) Prior Publication Data
US 2007/0069210 A1    Mar. 29, 2007

(30) Foreign Application Priority Data
Nov. 14, 2003    (JP) .............................. 2003-386023

(51) Int. Cl.
*H01L 31/00*    (2006.01)
(52) U.S. Cl. .............................. 257/57; 257/59; 257/66; 257/72
(58) Field of Classification Search .................... 257/57, 257/59, 66, 72
See application file for complete search history.

(56) References Cited

U.S. PATENT DOCUMENTS 5,084,905 A * 1/1992 Sasaki et al. ................. 257/776

(Continued)

FOREIGN PATENT DOCUMENTS

CN    1175048    3/1998

(Continued)

OTHER PUBLICATIONS

Office Action (Application No. 200480040486.4; PCTCN7507) Dated Sep. 14, 2007 with English Translation.

(Continued)

*Primary Examiner*—Thanh V Pham
*Assistant Examiner*—Tony Tran
(74) *Attorney, Agent, or Firm*—Nixon Peabody LLP; Jeffrey L. Costellia

(57) ABSTRACT

As a substrate gets larger, time of manufacture is increased due to the repetition of film formations and etchings; waste disposal costs of etchant and the like are increased; and material efficiency is significantly reduced. A base film for improving adhesion between a substrate and a material layer formed by a droplet discharge method is formed in the invention. Further, a manufacturing method of a liquid crystal display device according to the invention includes at least one step for forming the following patterns required for manufacturing a liquid crystal display device without using a photomask: a pattern of a material layer typified by a wiring (or an electrode) pattern, an insulating layer pattern; or a mask pattern for forming another pattern.

20 Claims, 18 Drawing Sheets

U.S. PATENT DOCUMENTS

| | | | |
|---|---|---|---|
| 5,747,930 | A | 5/1998 | Utsugi |
| 5,926,242 | A | 7/1999 | Kataoka et al. |
| 6,614,053 | B1 | 9/2003 | Takenaka |
| 6,639,265 | B2 * | 10/2003 | Arao et al. ............. 257/303 |
| 6,767,772 | B2 | 7/2004 | Takenaka |
| 2001/0044259 | A1 | 11/2001 | Akedo |
| 2002/0006558 | A1 * | 1/2002 | Kobayashi et al. ......... 430/7 |
| 2002/0056838 | A1 | 5/2002 | Ogawa |
| 2002/0104995 | A1 | 8/2002 | Yamazaki et al. |
| 2003/0127974 | A1 | 7/2003 | Miyazawa |
| 2003/0165714 | A1 | 9/2003 | Lee et al. |
| 2003/0168966 | A1 | 9/2003 | Kobayashi et al. |
| 2004/0005739 | A1 | 1/2004 | Furusawa |
| 2005/0026423 | A1 | 2/2005 | Yamazaki |
| 2005/0037614 | A1 | 2/2005 | Fukuchi |
| 2007/0120471 | A1 | 5/2007 | Yamazaki et al. |
| 2007/0146568 | A1 * | 6/2007 | Yamazaki et al. ......... 349/43 |

FOREIGN PATENT DOCUMENTS

| | | |
|---|---|---|
| EP | 0 684 753 A1 | 11/1995 |
| EP | 1 209 748 A1 | 5/2002 |
| JP | 7-312290 | 11/1995 |
| JP | 2000-221489 | 8/2000 |
| JP | 2000-259099 | 9/2000 |
| JP | 2000-269336 | 9/2000 |
| JP | 2001-281438 | 10/2001 |
| JP | 2003-318133 * | 4/2002 |
| JP | 2003-50405 | 2/2003 |
| JP | 2003-58077 | 2/2003 |
| JP | 2003-315829 | 11/2003 |
| JP | 2003-318133 | 11/2003 |
| WO | WO 2005-048221 A1 | 5/2005 |
| WO | WO 2005-048223 A1 | 5/2005 |

OTHER PUBLICATIONS

International Search Report for (PCT/JP2004/016795) dated Feb. 15, 2005.

Written Opinion of the International Searching Authority for (PCT/JP2004/016795) dated Feb. 15, 2005.

Corrected Version of the Written Opinion of the International Searching Authority for (PCT/JP2004/016814) dated Mar. 1, 2005.

International Search Report for (PCT/JP2004/016814) dated Mar. 1, 2005.

Office Action (Application No. 200480040486.6; PCTCN7507) dated Sep. 14, 2007 with English Translation.

* cited by examiner terminal portion | pixel portion

LIQUID CRYSTAL DISPLAY DEVICE AND METHOD FOR MANUFACTURING THE SAME

TECHNICAL FIELD

The present invention relates to a semiconductor device having a circuit that is composed of a thin film transistor (hereinafter referred to as TFT) and a method for manufacturing the semiconductor device. An example of the semiconductor device is electronic device having an electro-optical device typified by a liquid crystal display device as one of its parts.

In this specification, the term semiconductor device refers to devices that function by utilizing semiconductor characteristics. Further, electro-optical devices, semiconductor circuits, and electronic devices are all regarded as semiconductor devices.

BACKGROUND ART

In late years, a technology for forming a thin film transistor (TFT) using a semiconductor thin film (a thickness of around several nanometers to several hundred nanometers) formed over a substrate having an insulating surface has been attracting attention. Thin film transistors are broadly applied to electronic devices such as an IC or an electro-optical device, and are particularly developed as switching elements for image display devices at a rapid rate.

Conventionally, a liquid crystal display device is known as an image display device. Active matrix liquid crystal display devices are mostly used since they can offer higher definition images in comparison with passive matrix liquid crystal display devices. As to an active matrix liquid crystal display device, an image is generated on a screen by driving pixel electrodes arranged in matrix. Specifically, optical modulation of a liquid crystal layer disposed between a pixel electrode and a counter electrode is performed by applying voltage between the selected pixel electrode and a counter electrode corresponding to the pixel electrode. The optical modulation is recognized as an image by an observer.

The application range of such an electro-optical device of an active matrix type has been broaden, and it is required to make the device achieve higher definition, higher open area ratio, and higher reliability as well as to make the screen have a larger area. Further, requirements for improvements in productivity and cost minimization are also increased.

DISCLOSURE OF INVENTION

In manufacturing the above active matrix electro-optical device, steps of forming a thin film by sputtering or the like and patterning by photolithography are repeated thereby forming a TFT. As the photolithography technique, a photomask is used to form a photoresist pattern to be a mask for an etching process on a substrate.

In the case of using such a mask, steps of resist application, prebake, exposure, development, postbake, or the like and steps such as film formation of a coating and etching performed before/after the prescribed steps, and further steps of resist removal, washing, and drying, and the like are additionally required. Therefore, the manufacturing process can not be prevented from being complicated.

In particular, as a substrate that is to be a base material gets larger, time of manufacture is increased due to the repetition of film formation and etching; waste disposal costs of etchant and the like are increased; and material efficiency is significantly reduced.

In view of the above problems, it is an object of the present invention to provide a manufacturing method of an electro-optical device by which the manufacturing cost can be reduced.

A manufacturing method of a liquid crystal display device according to the invention includes at least one or more of steps for forming the following patterns required for manufacturing a liquid crystal display device without using a photomask: a pattern of a material layer typified by a wiring (or an electrode) pattern, an insulating layer pattern; or a mask pattern for forming another pattern.

A pattern of a material layer is formed by a droplet discharge method (for example, ink-jet method).

In addition, the invention provides a technology for easily obtaining an electrical connection between multi-layer wirings.

Specifically, the invention provides a technology for connecting multi-layer wirings without forming a contact hole having a high aspect ratio (ratio of the diameter to the depth of a contact hole) using photolithography. In a portion where the upper-layer wiring is electrically connected to the lower-layer wiring, a projection (hereinafter, also referred to as a "plug" or a "pillar") is provided on the lower-layer wiring. The projection may be a columnar conductive member or a member which is a stack of conductive members repeatedly applied by a droplet discharge method. Further, after an interlayer insulating film is formed by a coating method, the projection is exposed by etch back. Thus, the lower-layer wiring can be electrically connected with the upper-layer wiring through the projection.

As another method, a contact hole can be formed simultaneously with the formation of an interlayer insulating film by selectively forming the interlayer insulating film by a droplet discharge method.

As still another method, a projection formed with a liquid repellent organic film is provided on a lower-layer wiring in a portion where a connection between an upper-layer wiring and a lower-layer wiring is made. Further, after forming an interlayer insulating film by coating, only the projection is removed; thus, a contact hole can be formed. Then, an upper-layer wiring is formed so as to close the contact hole.

A liquid crystal display device disclosed in this specification of the invention includes: a thin film transistor including a gate electrode formed by a droplet discharge method over an area which is pretreated; a columnar conductive film formed by a droplet discharge method over a drain electrode of the thin film transistor; and a pixel electrode connected to the columnar conductive film.

In the above structure, the gate electrode, the drain electrode, or the columnar conductive film contains one selected from the group consisting of gold, silver, copper, platinum, palladium, tungsten, nickel, tantalum, bismuth, lead, indium, tin, zinc, titanium, and aluminum.

In each of the above structures, the thin film transistor includes an amorphous semiconductor or a semiamorphous semiconductor.

As to a television receiver disclosed in this specification of the invention, the liquid crystal display device according to any one of Claims 1 through 3 is included in a display screen.

Further, a method for manufacturing a liquid crystal display device, disclosed in this specification of the invention includes the steps of: forming a gate electrode over an area which is pretreated by a droplet discharge method; forming a first insulating film over the gate electrode; forming a semiconductor film over the first insulating film; forming a mask over the semiconductor film; patterning the semiconductor film using the mask; pretreating the patterned semiconductor film; forming a thin film transistor over the pretreated semiconductor film by forming a source or drain electrode by a droplet discharge method; forming a columnar conductive film over the source or drain electrode; forming a second insulating film so as to cover the columnar conductive film and the thin film transistor; forming a pixel electrode so as to be connected to the columnar conductive film over the second insulating film; forming a liquid crystal or a sealant by a droplet discharge method; and pasting with a counter substrate under reduced pressure.

As another method for manufacturing a liquid crystal display device, disclosed in this specification of the invention includes the steps of: forming a gate electrode by a droplet discharge method over an area which is pretreated; forming a first insulating film over the gate electrode; forming a semiconductor film over the first insulating film; forming a mask over the semiconductor film; patterning the semiconductor film using the mask; pretreating the patterned semiconductor film; forming a thin film transistor over the pretreated semiconductor film by forming a source or drain electrode by a droplet discharge method; forming a columnar organic film over the source or the drain electrode; forming a second insulating film so as to cover the columnar organic film and the thin film transistor; removing the columnar organic film; forming a pixel electrode so as to be connected to the source or drain electrode over the second insulating film; forming a liquid crystal or a sealant by a droplet discharge method; and pasting with a counter substrate under reduced pressure.

In the above structures, the second insulating film is repellent to the columnar organic film. Further in the above structures, the columnar organic film is removed by water washing.

The invention can be applied irrespective of the TFT structure. For example, the invention can be applied to a top gate TFT, a bottom gate (inverted staggered) TFT, and a staggered TFT. Further, without limitation to a single gate TFT, a multigate TFT which includes plural channel regions, for example, a double gate TFT may be used.

As an active layer of the TFT, an amorphous semiconductor film, a semiconductor film containing a crystal structure, a semiconductor compound film containing an amorphous structure can be appropriately used. Further, a semi-amorphous semiconductor film which is semiconductor having an intermediate structure of an amorphous structure and a crystal structure (including single crystal and polycrystal), and a tertiary state which is stable energetically, and including a crystalline region having a short distance order and lattice distortion (also referred to as a microcrystal semiconductor film) can be used as the active layer of the TFT. In the semi-amorphous semiconductor film, a crystal grain having a grain diameter from 0.5 nm to 20 nm is included in at least one region of the film, and in the Raman spectrum, the peak specific to silicon shifts to the lower side of wave number of $520\,cm^{-1}$. In addition, in the semi-amorphous semiconductor film, a diffraction peak of (111) and (220) derived from a Si crystal lattice is observed in x-ray diffraction. The semi-amorphous semiconductor film includes hydrogen or halogen at least 1 atom % as a neutralizer of an uncombined hand (a dangling bond). The semi-amorphous semiconductor film is manufactured by performing glow discharging decomposition (plasma CVD) of a silicide gas. As the silicide gas, $SiH_4$, additionally, $Si_2H_6$, $SiH_2Cl_2$, $SiHCl_3$, $SiCl_4$, $SiF_4$, or the like can be used. The silicide gas may be diluted with $H_2$, or $H_2$ and one or more of rare gas elements: He, Ar, Kr, and Ne. Dilution ratio is within the range from 2 times to 1000 times. Pressure is roughly within the range from 0.1 Pa to 133 Pa; power frequency, from 1 MHz to 120 MHz, preferably from 13 MHz to 60 MH; and substrate heating temperature, at most 300° C., preferably from 100° C. to 250° C. An atmospheric constitution impurity such as oxygen, nitrogen, or carbon as an impurity element within a film is preferably at most $1\times10^{20}$ atoms/cm$^3$, in particular, oxygen concentration is at most $5\times10^{19}$ atoms/cm$^3$, preferably, at most $1\times10^{19}$ atoms/cm$^3$. Note that electric field-effect mobility µ of a TFT in using a semi-amorphous film as an active layer is from 1 cm$^2$/Vsec to 10 cm$^2$/Vsec.

According to the invention, a material layer can be patterned without using a photo mask; thus, the material efficiency can be improved. Further, the manufacturing process can be simplified by skipping the steps of exposure and development in manufacturing a liquid crystal display device.

BEST MODE FOR CARRYING OUT THE INVENTION

Figure 1A:
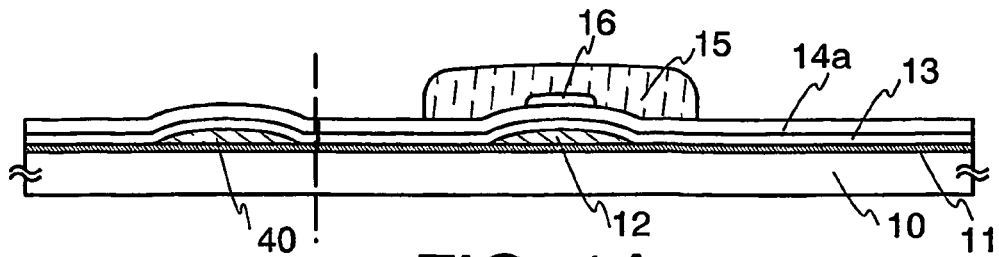
FIGS. 1A to 1E are figures showing Embodiment Mode 1.

Embodiment modes of the present invention will be described below.

Embodiment Mode 1

Here, a method for manufacturing an active matrix liquid crystal display device using an inverted staggered TFT as a switching element will be described. FIG. 1 shows a cross section of the manufacturing process.

First, a base film 11 for improving adhesion with a material layer to be later formed by a droplet discharge method is formed over a substrate 10. The base film 11 may be formed thin; accordingly, it can be regarded as base pretreatment. A photocatalyst (titanium oxide ($TiO_2$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), tungsten oxide ($WO_3$)) may be applied with a spray; alternatively, an organic material (polyimide, acryl, or a material having a skeletal structure including a bond of silicon (Si) and oxygen (O) which contains at least one of the group consisting of hydrogen, fluorine, alkyl group and aromatic hydrocarbon as a substituent) may be selectively applied by ink-jet method or sol-gel process.

A photocatalyst denotes a material which has a photocatalytic function. The photocatalyst is activated when it is irradiated with light of an ultraviolet light region (wavelength: equal to or less than 400 nm, preferably, equal to or less than 380 nm). A fine pattern can be made by discharging a conductor contained in a solvent on the photocatalyst by ink-jet method.

For example, $TiO_x$ is not hydrophilic but oleophilic, that is, water repellent before being irradiated with light. Light irradiation causes photocatalytic activity, and $TiO_2$ is converted into hydrophilic and non-oleophilic, that is, oil repellent. Note that $TiO_2$ can have both hydrophilic and oleophilic depending on a length of irradiation time.

Note that "hydrophilic" means a state which is easy to be got wet with water and has a contact angle of equal to or less than 30°. Specifically, a state having a contact angle of equal to or less than 5° is referred to as "super-hydrophilic". On the other hand, "water-repellent" means a state which is hard to be got wet with water and has a contact angle of equal to or more than 90°. Similarly, "oleophilic" means a state which is easy to be got wet with oil, and "oil-repellent" means a state which is hard to be got wet with oil. Note that the contact angle means an angle made by a formation face and a tangent to a droplet on the edge of a dropped dot.

Namely, a region irradiated with light (hereinafter, referred to as an irradiation region) becomes hydrophilic or super-hydrophilic (simply collectively referred to as hydrophilic). At this time, light irradiation is performed so that a width of an irradiation region is a desired width of a wiring. Thereafter, a dot including a conductive material mixed into a water-based solvent is discharged from above the irradiation region to the irradiation region by an ink-jet method. Then, a smaller wiring in width, that is, a narrower wiring than a diameter of a dot discharged merely by an ink-jet method can be formed. This is because the irradiation region is formed to have a desired width of a wiring, and then, a discharged dot can be prevented from spreading on a formation surface. Further, a wiring can be formed along the irradiation region even in the case where a dot is discharged out of alignment to some extent. Thus, a position of a wiring to be formed can be controlled with accuracy.

In the case of using a water-based solvent, it is preferable to add a surfactant in order to smoothly discharge a droplet from a nozzle of an inkjet apparatus.

In the case of discharging a conductive material mixed into an oil (alcohol) based solvent, a wiring can be similarly formed by discharging a conductive material onto a region which is not irradiated with light (hereinafter, referred to as a non-irradiation region) and discharging a dot from above the non-irradiation region to the non-irradiation region. Namely, opposite ends of a region where a wiring is to be formed, that is, the periphery surrounding the region where a wiring is to be formed may be irradiated with light, thereby forming an irradiation region. Since the irradiation region is oil-repellent at this time, a dot including a conductive material mixed into an oil (alcohol) based solvent is selectively formed in the non-irradiation region. Namely, light irradiation is performed so that a width of the non-irradiation region is a desired width of a wiring.

Note that a nonpolar solvent or a low polar solvent can be used as the oil (alcohol) based solvent. For example, terpineol, mineral spirit, xylene, toluene, ethyl benzene, mesitylene, hexane, heptane, octane, decane, dodecane, cyclohexane, or cyclooctane can be used.

Further, photocatalytic activity can be improved by doping a transition metal (such as Pd, Pt, Cr, Ni, V, Mn, Fe, Ce, Mo, or W) into the photocatalytic substance, and photocatalytic activity can be caused by light of a visible light region (wavelength: from 400 nm to 800 nm). This is because the transition metal can form a new level within a forbidden band of an active photocatalyst having a wide band gap and can expand a light absorption range to a visible light region. For example, an acceptor type such as Cr or Ni, a donor type such as V or Mn, an amphoteric type such as Fe, or other types such as Ce, Mo, and W can be doped. A wavelength of light can thus be determined depending on the photocatalytic substance. Therefore, light irradiation means to irradiate with light having such a wavelength that photocatalytically activates the photocatalytic substance.

When the photocatalytic substance is heated and reduced in a vacuum or under reflux of hydrogen, an oxygen defect is generated in crystal. Without doping a transition element, an oxygen defect plays a similar role to an electron donor in this way. Specifically, in the case of forming by a sol-gel method, the photocatalytic substance may not be reduced since an oxygen defect exists from the beginning. In addition, an oxygen defect can be formed by doping a gas of $N_2$ or the like.

Here, an example of carrying out base pretreatment for improving the adhesion in the case of discharging a conductive material onto the substrate has been shown. Alternatively, in the case of forming a material layer (for example, an organic layer, an inorganic layer, and a metal layer) by a droplet discharge method over another material layer (for example, an organic layer, an inorganic layer, and a metal layer) or a conductive layer formed by discharging, a TiOx film may be formed to improve the adhesion between the material layers. Thus, in the case of making patterns by discharging a conductive material by a droplet discharge method, it is desirable to perform base pretreatment before and after the formation of the conductive material layer in order to improve the adhesion.

The substrate 10 may use a plastic substrate having the heat resistance that can withstand processing temperature or the like other than a non-alkaline glass substrate such as barium borosilicate glass, alumino borosilicate glass, or aluminosilicate glass manufactured with a fusion method or a floating method. Further, a semiconductor substrate of such as single crystal silicon, a metal substrate of such as stainless steel, a ceramic substrate, or the like whose substrate is provided with an insulating layer may be applied in the case of a reflective liquid crystal display device.

Next, after the conductive material is applied by a droplet discharge method typified by ink-jet method, baking is carried out in an oxygen atmosphere, thereby forming a metal wiring 12 to be a gate electrode or a gate wiring. Further, a wiring 40 extending to a terminal area is also formed similarly. Although not shown, a capacitor electrode or a capacitor wiring for forming a storage capacitor is also formed.

As the wiring material, any one of gold (Au), silver (Ag), copper (Cu), platinum (Pt), palladium (Pd), tungsten (W), nickel (Ni), tantalum (Ta), bismuth (Bi), lead (Pb), indium (In), tin (Sn), zinc (Zn), titanium (Ti), and aluminum (Al); an alloy thereof; dispersed nanoparticles thereof; or silver halide particles is used. In particular, the gate wiring is preferable to be low resistance. Therefore, a material in which any one of gold, silver, or copper dissolved or dispersed in a solvent is preferably used, and more preferably silver or copper with low resistance is used in consideration of a specific resistance value. However, in the case of using silver or copper, a barrier film may be additionally provided for an impurity measure. A solvent corresponds to ester such as butyl acetate, alcohols such as isopropyl alcohol, an organic solvent such as acetone, or the like. Surface tension and viscosity are appropriately adjusted by adjusting density of a solvent and adding a surfactant or the like.

A diameter of a nozzle used in a droplet discharge method is set to be from 0.02 μm to 100 μm (preferably, 30 μm or less), and a discharging amount of a composition discharged from the nozzle is preferably set to be from 0.001 pl to 100 pl (preferably, 10 pl or less). There are two types of an on-demand type and a continuous type for a droplet discharge method, both of which may be used. Furthermore, there is a piezoelectric system using properties transformed by applying voltage pressure of a piezoelectric material and a heating system that boils a composition by a heater provided in a nozzle and discharges the composition for a nozzle to be used in a droplet discharge method, both of which may be used. A distance between a subject and a discharge opening of a nozzle is preferable to be made as close as possible to drop a droplet at a desired place, which is preferably set to be from 0.1 mm to 3 mm (preferably, 1 mm or less). While keeping the relative distance, one of the nozzle and the subject moves and a desired pattern is drawn. In addition, plasma treatment may be carried out on a surface of the subject before discharging a composition. This is to take advantage of a surface of the subject becoming hydrophilic and lyophobic when plasma treatment is carried out. For example, it becomes hydrophilic to deionized water and it becomes lyophobic to a paste dissolved with alcohol.

A step of discharging a composition may be carried out under low pressure so that a solvent of the composition can be volatilized while the composition is discharged and hit on a subject and later steps of drying and baking can be skipped or shorten. After discharging a composition, either or both steps of drying and baking is carried out by irradiation of laser light, rapid thermal annealing, heating furnace, or the like under the atmospheric pressure or the low pressure. Both the steps of drying and baking are steps of heat treatment. For example, drying is carried out at 100° C. for 3 minutes and baking is carried out at temperatures from 200° C. to 350° C. for from 15 minutes to 120 minutes. In order to carry out the steps of drying and baking well, a substrate may be heated, of which temperatures are set to be from 100° C. to 800° C. (preferably, temperatures from 200° C. to 350° C.), though depending on a material of a substrate or the like. Through this step, a solvent in a composition is volatilized or dispersant is removed chemically, and a resin around cures and shrink, thereby accelerating fusion and welding. It is carried out under the oxygen atmosphere, the nitrogen atmosphere, or the atmosphere. However, this step is preferable to be carried out under an oxygen atmosphere in which a solvent decomposing or dispersing a metal element is easily removed.

The adhesion of a metal film which is later to be formed by a droplet discharge method can be significantly improved by forming the base film or by carrying out base pretreatment. Thus, the adhesion which can resist even soaked in dilate hydrofluoric acid (diluted 1:100) for one minute or more, and can resist tape adhesion test can be obtained.

Next, a gate insulating film 13 is formed by plasma CVD, sputtering, or coating to have a single layer structure or a layered structure. Desirably, a stack of three layers of an insulating layer formed of silicon nitride, an insulating layer formed of silicon oxide, and an insulating layer formed of silicon nitride. Alternatively, a stack of two layers of an insulating layer formed of silicon nitride and an insulating layer formed of polyimide. Note that a rare gas element such as argon is preferably contained in a reactive gas, which is mixed into the insulating film to be formed.

A semiconductor film 14a is formed. The semiconductor film 14a is formed with an amorphous semiconductor film or a semiamorphous semiconductor film which is formed by vapor phase growth or sputtering using a semiconductor material gas typified by silane and germanium.

As an amorphous semiconductor film, an amorphous silicon film obtained by PCVD using $SiH_4$ or a gas mixture of $SiH_4$ and $H_2$. Further, as a semiamorphous semiconductor film, a semiconductor film obtained by PCVD using a gas mixture in which $SiH_4$ is diluted 1:3 to 1:1000 in $H_2$, a gas mixture in which $Si_2H_6$ is diluted with $GeF_4$ with a gas flow rate of 20:0.9 to 40:0.9 ($Si_2H_6$:$GeF_4$), or a gas mixture of $SiH_4$ and $H_2$. Note that a semiamorphous silicon film is preferably used since more crystallinity can be given to the interface with the base.

An insulating layer 16 is formed by plasma CVD or sputtering. The patterning may be performed by etching with the use of a mask formed by a droplet discharge method, or photolithography. The insulating layer 16 is made to remain on the semiconductor layer opposite to the gate electrode so as to serve as a channel protective layer. Further, the insulating layer 16 is preferably formed with a fine film thereby acquiring purity of the surface and preventing the semiconductor layer from being contaminated by impurities such as an organic material, a metal material, or moisture. In a glow discharge decomposition method, a silicon nitride film which is formed by diluting a silicide gas by from 100 times to 500 times with a silicide gas such as argon is preferable since a fine film can be formed even at a deposition temperature of 100° C. or less.

Subsequently, a mask 15 covering the insulating layer 16 is formed by a droplet discharge method (FIG. 1A). A resin material such as an epoxy resin, an acrylic resin, a phenol resin, a novolac resin, a melamine resin, or a urethane resin is used for the mask 15. In addition, the mask 213 is formed with a droplet discharge method by using an organic material such as benzocyclobutene, parylene, flare, or light-transmitting polyimide; a compound material made from polymerization such as siloxane-based polymer; a composition material containing water-soluble homopolymer and water-soluble copolymer; or the like. Alternatively, a commercial resist material containing a photosensitizer may be used. For example, a typical positive type resist such as a novolac resin and naphthoquinonediazide compound that is a photosensitizer, a negative type resist such as a base resin, diphenylsilane diol, and an acid generation agent, or the like may be used. In using any one of materials, surface tension and viscosity are appropriately controlled by diluting the concentration of a solvent or adding a surfactant or the like.

Next, a semiconductor film 14a except the area covered with the mask 15 is removed by dry etching or wet etching, so that a semiconductor layer 14b to be an active layer is formed.

After the mask 15 is removed, an n-type semiconductor film 17 is formed over the entire surface. In the case where the n-type semiconductor film is provided, the contact resistance between the semiconductor film and the electrode is reduced, which is preferable. The n-type semiconductor film may be provided as necessary. The n-type semiconductor film 17 may be formed with an amorphous semiconductor film or a semi-amorphous semiconductor film formed by PCVD using silane gas and phosphine gas.

Figure 1B:
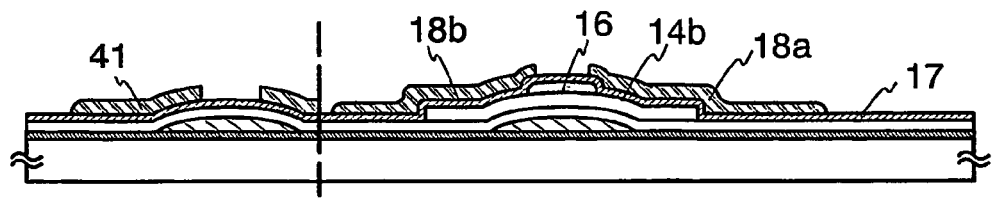

Next, a composition containing a conductive material (such as Ag (silver), Au (gold), Cu (copper), W (tungsten), or Al (aluminum)) is selectively discharged, so that source and drain wirings 18a and 18b are formed. A connection wiring 41 is similarly formed in a terminal area (FIG. 1B).

The n-type semiconductor film 17 is etched in a self-aligned manner by using the source and drain wirings 18a and 18b as masks thereby forming source and drain regions 19a and 19b. Thus, a channel stop TFT 30 is completed. The insulating layer 16 is used as an etching stopper of the n-type semiconductor film Next, the area except the terminal area is covered with a resin such as a resist by using a shadow mask. In the terminal area, a part of a wiring 40 is exposed by etching a gate insulating film 13 using the connection wiring 41 as a mask. A resist mask formed by screen printing may be used as an etching mask instead of the shadow mask. In addition, the gate insulating film 13 may be etched without covering the area except the terminal area with a resist. However, there are problems that the gate insulating film of the area which is not overlapped with the source and drain wirings 18a and 18b is etched, and that the semiconductor layer would be exposed since the insulating layer 16 is etched.

Next, a conductor 42 for connecting the wiring 40 extending to the terminal area and the connection wiring 41 is formed. The conductor 42 may be formed by printing or by a droplet discharge method. In the case of using a droplet discharge method, a composition containing a conductive material (such as Ag (silver), Au (gold), Cu (copper), W (tungsten), or Al (aluminum)) is selectively discharged to form the conductor 42.

A projection (pillar) 20 formed of a conductive material is formed over a part of the source or drain wiring 18a. A stack is formed by repeating discharging and baking of a composition containing a conductive material (such as Ag (silver), Au (gold), Cu (copper), W (tungsten), or Al (aluminum)), so that the projection (pillar) 20 is formed. A projection (pillar) 43 is also formed over the connection wiring 41 in a similar manner. Alternatively, the projections (pillars) 20 and 43 may be formed by patterning a metal film formed by sputtering. In this case, the projection (pillar) is shaped like a column.

Figure 1C:
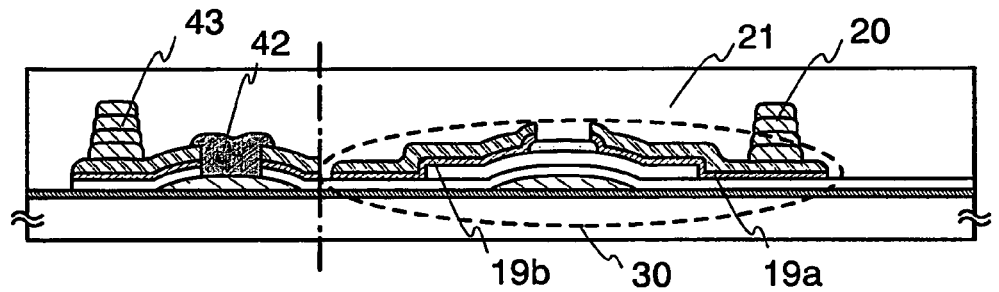

A interlayer insulating film 21 which is flat is formed by coating (FIG. 1C). The interlayer insulating film 21 which is flat and formed by coating denotes an interlayer insulating film formed by applying a liquid composition. For the interlayer insulating film 21 which is flat formed by coating, an organic material such as acrylic or polyimide; or spin on glass (hereinafter also referred to as SOG) that is a coating which is formed by application of an insulating material dissolved in an organic solvent and by heat treatment thereafter, for example, a material in which a siloxane bond is formed by baking siloxane polymer or the like may be used. The interlayer insulating film 21 may be formed with an inorganic insulating film such as a silicon oxide film formed by a vapor phase growth method or sputtering instead of coating. Further, after a silicon nitride film is formed as a protective film by PCVD or sputtering, the interlayer insulating film 21 may be formed by coating.

The interlayer insulating film 21 may be formed by a droplet discharge method. Further, the interlayer insulating film 21 may be formed by a droplet discharge method before final bake of the projections (pillars) 20 and 43; thus, the final bake thereof is carried out simultaneously.

In forming the interlayer insulating film 21 which is flat by coating or a droplet discharge method, it is preferable to carry out final bake after minute irregularities on the surface are planarized with an air knife instead of a squeegee.

Parts of the interlayer insulating film over the projections (pillars) 20 and 43 are removed by etch back of the entire surface, so that the projections (pillars) 20 and 43 are exposed. Alternatively, the interlayer insulating film may be grinded by chemical mechanical polishing (CMP) and thereafter carrying out etch back of the entire surface; thus, the projections (pillars) 20 and 43 can be exposed.

Figure 1D:
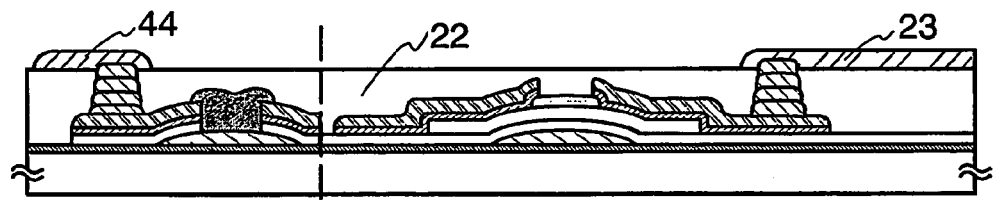

A pixel electrode 23 in contact with the projection (pillar) 20 is formed over an interlayer insulating film 22 (FIG. 1D). A terminal electrode 44 in contact with the projection (pillar) 43 is similarly formed. In the case of manufacturing a transmissive liquid crystal display panel, a pattern formed of a composition containing indium tin oxide (ITO), indium tin oxide containing silicon oxide (ITSO), zinc oxide (ZnO), tin oxide ($SnO_2$), or the like may be formed by a droplet discharge method or printing, and baked to form the pixel electrode 23 and the terminal electrode 44. In the case of manufacturing a reflective liquid crystal display panel, the pixel electrode 23 and the terminal electrode 44 can be formed of a composition mainly containing particles of a metal such as Ag (silver), Au (gold), Cu (copper), W (tungsten), or Al (aluminum) by a droplet discharge method. As another method, a transparent conductive film or a light reflective conductive film is formed by sputtering, and a mask pattern is formed by a droplet discharge method; thus, the pixel electrode may be formed by a plurality of etching methods. Note that the surface of the interlayer insulating film 22 is planarized by etch back or CMP, so that a flat pixel electrode 23 can be formed.

Figure 10:
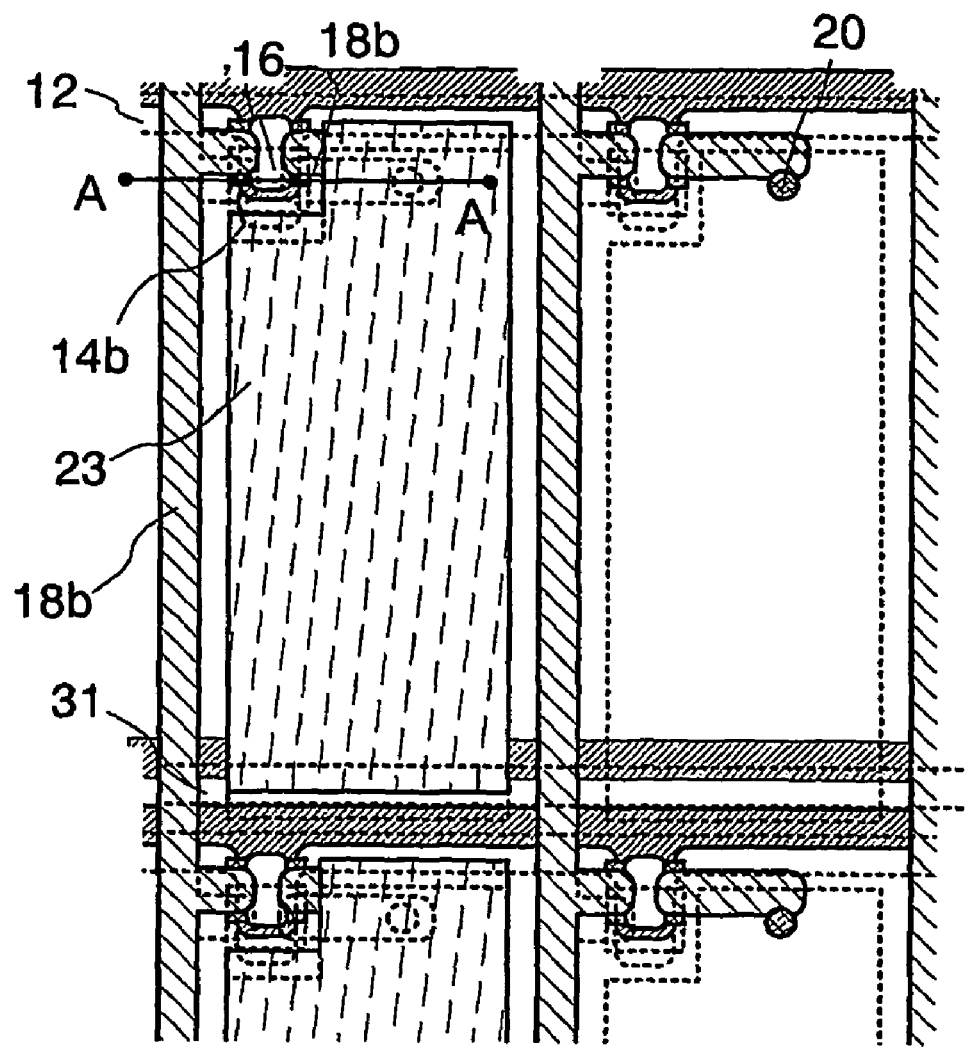
FIG. 10 is a top view of pixels according to Embodiment Mode 1.

FIG. 10 is an enlarged top view of a part of a pixel area. Further, FIG. 10 shows a pixel electrode in the course of being formed; a pixel electrode is formed in the left pixel whereas a pixel electrode is not yet provided in the right pixel. A cross-sectional view taken along the solid line A-A' in FIG. 10 corresponds to the cross section of the pixel area shown in FIG. 1D; accordingly, the same reference numerals are used for the corresponding parts. The pixel area is provided with a capacitor wiring 31, a storage capacitor using a gate insulating film as a dielectric, a pixel electrode 23, and the capacitor wiring 31 overlapping the pixel electrode.

Through the above steps, a TFT substrate for a liquid crystal display panel in which a bottom gate (inverted staggered) TFT and a pixel electrode are formed over a substrate 10 is completed.

Next, an alignment layer 24a is formed so as to cover the pixel electrode 23. The alignment layer 24a may be formed by a droplet discharge method, screen printing, or off-set printing. Subsequently, the surface of the alignment layer 24a is rubbed.

A counter substrate 25 is provided with a color filter formed with a color layer 26a, a light shielding layer (black matrix) 26b, and an over coat layer 27; a counter electrode 28 formed with a transparent electrode; and the alignment layer 24b thereover. Here, a sealant with a closed pattern (not shown) is used since liquid crystal 29 is dropped. Alternatively, dip coating (pumping up method) by which liquid crystal 29 is injected by capillary phenomenon after pasting the TFT substrate and a counter substrate may be employed using a seal pattern having an opening.

Next, liquid crystal 29 is dropped under reduced pressure so as to prevent bubbles from entering, and the TFT substrate and the counter substrate are pasted together. Liquid crystal 29 is dropped once or several times in the closed seal pattern. A twisted nematic (TN) mode is mostly employed as an alignment mode of a liquid crystal. In this mode, the alignment direction of liquid crystal molecules is twisted at 90° according to the polarization of light from its entrance to the exit. In the case of manufacturing a TN liquid crystal display device, an alignment layer is formed on both of the substrates; the substrates are pasted together so that the rubbing directions of the substrates are orthogonalized.

The gap between the pair of the substrates may be maintained by spraying spherical spacers, forming a column spacer formed of resin, or mixing fillers into the sealant. The columnar spacer is formed of an organic resin material containing as a main component at least one material selected from the group consisting of acrylic, polyimide, polyimide-amide, and epoxy; any one material of silicon oxide, silicon nitride, and silicon oxynitride; or an inorganic material composed of a stack of these materials.

Next, unnecessary substrate is divided. In the case of obtaining a plurality of panels from one substrate, each panel is separated off. In the case of obtaining one panel from one substrate, the separation step can be skipped by pasting a counter substrate which is previously cut.

Figure 1E:
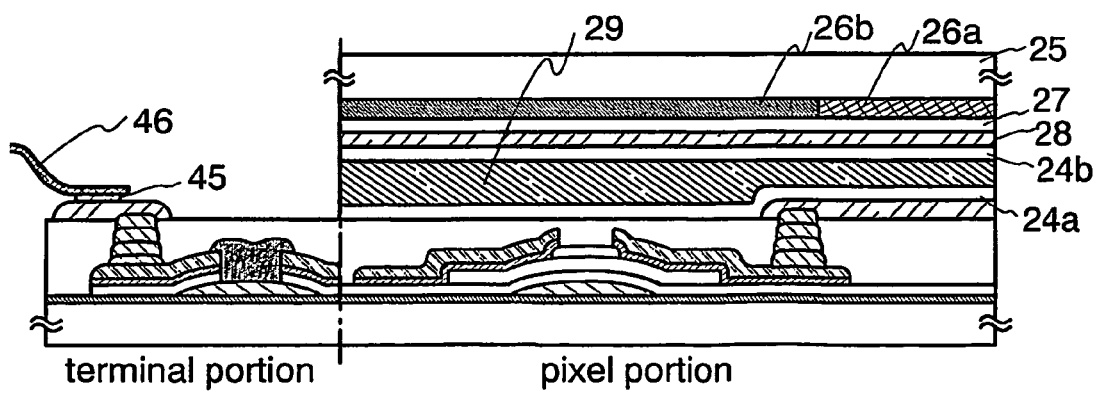

An FPC 46 is bonded to the TFT substrate with an anisotropic conductive layer 45 therebetween by a known method. A liquid crystal module is completed through the above steps (FIG. 1E). Further, an optical film is provided as necessary. In the case of a transmissive liquid crystal display device, polarizers are respectively pasted to both an active matrix substrate and a counter substrate.

As described above, according to this embodiment mode, the light exposure using a photomask is skipped by using the projections (pillars) 20 and 43; thus, the process can be simplified and the time of manufacture can be reduced. A liquid crystal display device can be easily manufactured by even using a glass substrate after five generations, one side of which exceeds 1000 mm by forming each kind of pattern directly on a substrate by using a droplet discharge method.

In this embodiment mode, a process in which a light exposure process using a photomask is not carried out; however, a part of patterning may be performed by light exposure using a photomask.

Embodiment Mode 2

Here, an example in which the connection method is different from Embodiment Mode 1 will be shown. FIG. 2A to 2E show a cross section of manufacturing steps of an active matrix liquid crystal display device using an inverted staggered TFT as a switching element.

Figure 2A:
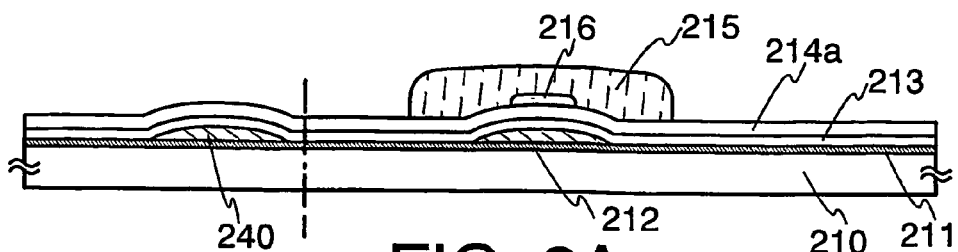
FIGS. 2A to 2E are figures showing Embodiment Mode 2.

First, a state equivalent to FIG. 1A is made according to the steps shown in Embodiment Mode 1. A base film 211, a metal wiring 212, a wiring 240 extending to a terminal area are formed over a substrate 210. Further, a gate insulating film 213, a semiconductor film 214a, and an insulating layer 216 are sequentially formed thereover. A mask 215 covering the insulating layer 216 is formed by a droplet discharge method (FIG. 2A).

Next, a semiconductor film 214a except the area covered with the mask 215 is removed by dry etching or wet etching, so that a semiconductor layer 214b to be an active layer is formed.

Figure 2B:
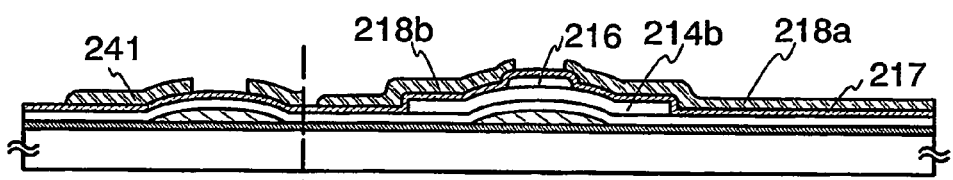

After the mask 215 is removed, an n-type semiconductor film 217 is formed over the entire surface. The n-type semiconductor film 217 may be provided as necessary. The n-type semiconductor film 217 may be formed with an amorphous semiconductor film or a semiamorphous semiconductor film formed by PCVD using phosphine gas Next, a composition containing a conductive material (such as Ag (silver), Au (gold), Cu (copper), W (tungsten), or Al (aluminum)) is selectively discharged, so that source and drain wirings 218a and 218b are formed. A connection wiring 241 is similarly formed in a terminal area (FIG. 2B). Since the drain wiring 218b serves as a pixel electrode (reflective electrode), it is preferable to use Ag (silver), Al (aluminum), or the like, which is highly reflective. Since the pixel electrode is formed by a droplet discharge method, irregularities for preventing mirror surface reflection of the reflective electrode can be easily formed. Conventionally, after the pixel electrode is formed, the surface is provided with irregularities by adding the steps of sand blasting, etching, or the like to prevent mirror reflection and to allow reflected light to scatter, thereby enhancing whiteness.

The n-type semiconductor film 217 is etched in a self-aligned manner by using the source and drain wirings 218a and 218b as masks thereby forming source and drain regions 219a and 219b. Thus, a channel stop TFT 230 is completed. The insulating layer 216 is used as an etching stopper of the n-type semiconductor film 217.

Next, the area except the terminal area is covered with a resin such as a resist by using a shadow mask. In the terminal area, a part of a wiring 240 is exposed by etching a gate insulating film 213 using the connection wiring 241 as a mask.

Next, a conductor 242 for connecting the wiring 240 extending to the terminal area and the connection wiring 241 is formed. The conductor 242 may be formed by printing or by a droplet discharge method. In the case of using a droplet discharge method, a composition containing a conductive material (such as Ag (silver), Au (gold), Cu (copper), W (tungsten), or Al (aluminum)) is selectively discharged to form the conductor 242.

Figure 2C:
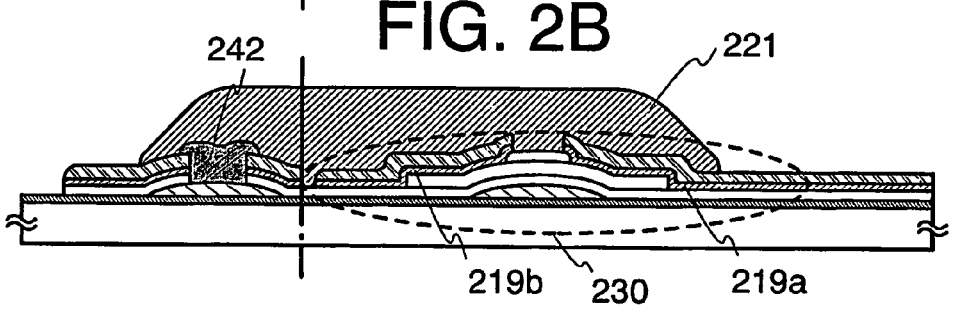

Next, an interlayer insulating film 221 is selectively formed by a droplet discharge method (FIG. 2C). In the pixel area, the interlayer insulating film is formed so as to cover the area except the part later to be a pixel electrode. Droplet discharge and bake may be repeated two or more times to make the interlayer insulating film thick enough. In the terminal area, the interlayer insulating film 221 is provided so as not to cover the part later to be a terminal electrode. Thus, the interlayer insulating film is not provided in the areas where connection is made or the insulating film is not required. Accordingly, the formation of contact holes is redundant.

The interlayer insulating film 221 can be formed of an insulating material which can be applied by a droplet discharge method; for example, a photosensitive or non-photosensitive organic material (polyimide, acrylic, polyamide, polyimide amide, benzocyclobutene, or a resist material), siloxane, polysilazane, or a layered structured thereof can be used. Siloxane is formed with a polymer material with a skeletal structure having a bond of silicon (Si) and oxygen (O) which contains at least hydrogen as a substituent, or contains at least one of fluorine, alkyl group, and aromatic hydrocarbon. Polysilazane is formed with a liquid material, that is, a polymer material having a bond of silicon (Si) and nitrogen (N).

Figure 2D:
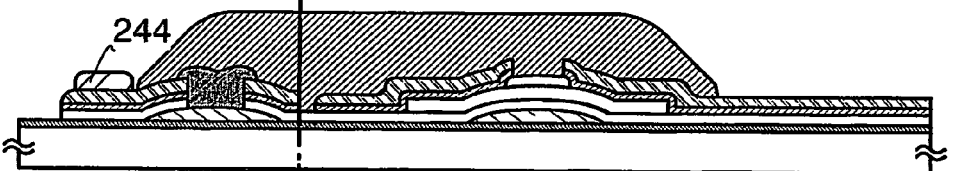

Next, a terminal electrode 244 in contact with a connection wiring 241 is formed by a droplet discharge method or printing (FIG. 2D). A composition containing indium tin oxide (ITO), indium tin oxide containing silicon oxide (ITSO), zinc oxide (ZnO), tin oxide ($SnO_2$), or the like is used for the terminal electrode 244.

Note that, the terminal electrode 244 may be formed before the formation of the interlayer insulating film 221; or may be formed concurrently with the interlayer insulating film 221 by using a head by which different materials are discharged simultaneously. Further, only the baking steps of the terminal electrode 244 and the interlayer insulating film 221 may be performed in common.

Through the above steps, a TFT substrate for a reflective liquid crystal display panel in which a bottom gate (inverted staggered) TFT and a pixel electrode are formed over a substrate 210 is completed.

Next, an alignment layer 224a is formed so as to cover the pixel electrode 218a. The alignment layer 224a may be formed by a droplet discharge method, screen printing, or off-set printing. Subsequently, the surface of the alignment layer 224a is rubbed.

A counter substrate 225 is provided with a color filter formed with a color layer 226a, a light shielding layer (black matrix) 226b, and an over coat layer 227; a counter electrode 228 formed with a transparent electrode; and the alignment layer 224b thereover. Here, a sealant with a closed pattern (not shown) is used since liquid crystal 229 is dropped. Alternatively, dip coating (pumping up method) by which liquid crystal 229 is injected by capillary phenomenon after pasting the TFT substrate and a counter substrate may be employed using a seal pattern having an opening.

Next, liquid crystal 229 is dropped under reduced pressure so as to prevent bubbles from entering, and the TFT substrate and the counter substrate are pasted together. Liquid crystal 229 is dropped once or several times in the closed seal pattern. A twisted nematic (TN) mode is mostly employed as an alignment mode of a liquid crystal. In this mode, the alignment direction of liquid crystal molecules is twisted at 90° according to the polarization of light from its entrance to the exit. In the case of manufacturing a TN liquid crystal display device, an alignment layer is formed on both of the substrates; the substrates are pasted together so that the rubbing directions of the substrates are orthogonalized.

The gap between the pair of the substrates may be maintained by spraying spherical spacers, forming a column spacer formed of resin, or mixing fillers into the sealant. The columnar spacer is formed of an organic resin material containing as a main component at least one material selected from the group consisting of acrylic, polyimide, polyimideamide, and epoxy; any one material of silicon oxide, silicon nitride, and silicon oxynitride; or an inorganic material composed of a stack of these materials.

Next, unnecessary substrate is divided. In the case of obtaining a plurality of panels from one substrate, each panel is separated off. In the case of obtaining one panel from one substrate, the separation step can be skipped by pasting a counter substrate which is previously cut.

Figure 2E:
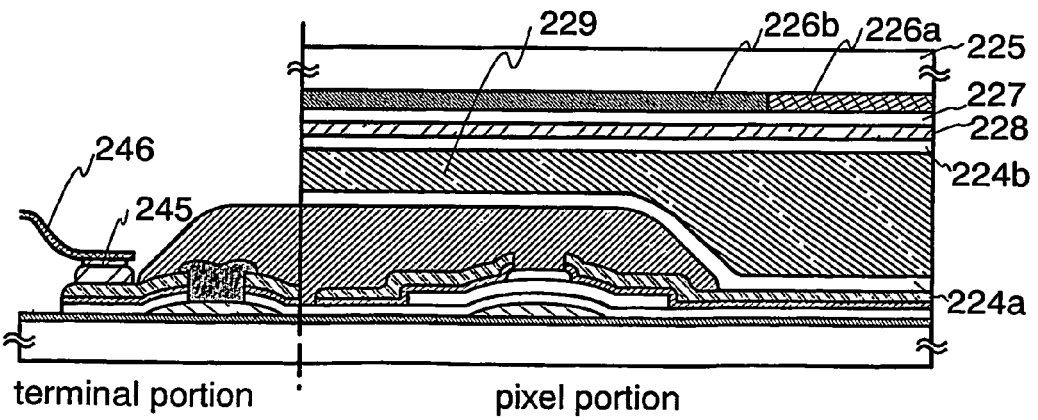

An FPC 246 is bonded to the TFT substrate with an anisotropic conductive layer 245 therebetween by a known method. A liquid crystal module is completed through the above steps (FIG. 2E). Further, an optical film is provided as necessary. In the case of a transmissive liquid crystal display device, polarizers are respectively pasted to both an active matrix substrate and a counter substrate.

As described above, according to this embodiment mode, the light exposure using a photomask is skipped by selectively forming an interlayer insulating film by a droplet discharge method; thus, the process can be simplified and the time of manufacture can be reduced. A liquid crystal display device can be easily manufactured by even using a glass substrate after five generations, one side of which exceeds 1000 mm by forming each kind of pattern directly on a substrate by using a droplet discharge method.

In this embodiment mode, a process in which a light exposure process using a photomask is not carried out; however, a part of patterning may be performed by light exposure using a photomask.

Embodiment Mode 3

Here, an example in which the connection method is different from Embodiment Mode 1 will be shown. FIGS. 3A to 3D show a cross section of manufacturing steps of an active matrix liquid crystal display device using an inverted staggered TFT as a switching element.

First, a state equivalent to FIG. 1C is made according to the steps shown in Embodiment Mode 1. A base film 311, a metal wiring 312, a wiring 340 extending to a terminal area are formed over a substrate 310. Further, a gate insulating film 313, a semiconductor film, and an insulating layer 316 are sequentially formed thereover. A mask covering the insulating layer 316 is formed by a droplet discharge method. Next, a semiconductor film except the area covered with the mask is removed by dry etching or wet etching, so that a semiconductor layer 314 to be an active layer is formed. After the mask is removed, an n-type semiconductor film is formed over the entire surface. Next, a composition-containing a conductive material (such as Ag (silver), Au (gold), Cu (copper), W (tungsten), or Al (aluminum)) is selectively discharged, so that source and drain wirings 318a and 318b, and a connection wiring 341 are formed. The n-type semiconductor film is etched in a self-aligned manner by using the source and drain wirings 318a and 318b as masks thereby forming source and drain regions 319a and 319b. Thus, a channel stop TFT 330 is completed. The insulating layer 316 is used as an etching stopper of the n-type semiconductor film. Next, the area except the terminal area is covered with a resin such as a resist by using a shadow mask. In the terminal area, the gate insulating film 313 is etched to expose a part of the wiring 340 by using the connection wiring 341 as a mask. Further, a conductor 342 for connecting the wiring 340 extending to the terminal area and the connection wiring 341 is formed.

A projection (pillar) 320 formed of a liquid repellent (water repellent, oil repellent) material is formed over a part of the source or drain wiring 318a by a droplet discharge method. A stack is formed by repeating discharging and baking of a composition containing a liquid repellent material (a fluorine based resin such as fluoroalkyl silane (FAS)), so that the projection (pillar) 320 is formed. Also, a projection (pillar) 343 is formed on the connecting wiring 341. The projections (pillars) 320 and 343 may be formed of a material which is not liquid repellent, and may be thereafter made liquid repellent by $CF_4$ plasma treatment or the like. For example, after the projections (pillars) are formed of a water soluble resin such as polyvinyl alcohol (PVA), $CF_4$ plasma treatment may be performed to make the projections (pillars) liquid repellent.

Further, a contact hole can be formed without performing $CF_4$ plasma treatment by using a liquid repellent material. After a liquid repellent material (a fluorine based resin such as fluoroalkyl silane (FAS)) is applied over the entire surface, a mask is formed of a water soluble resin such as polyimide and polyvinyl alcohol (PVA). The liquid repellent material on the area except where the mask is formed is removed by $O_2$ ashing or the like, and the mask is removed. Here, only the area where the mask is removed is liquid repellent. When an insulating material is thereafter applied over the entire surface, the insulating film is not formed over the area where the mask is removed (the area which is liquid repellent). Thus, an insulating film in which only the desired area is exposed can be obtained.

Next, a flat interlayer insulating film 322 is formed. A flat film may be obtained by using a coating method. Alternatively, the interlayer insulating film 322 may be formed by a droplet discharge method, and minute projections on the surface may be planarized with an air knife. For the flat interlayer insulating film 322, an organic material such as acrylic or polyimide; or spin on glass (hereinafter also referred to as SOG) that is a coating which is formed by application of an insulating material dissolved in an organic solvent and by heat treatment thereafter, for example, a material in which a siloxane bond is formed by baking siloxane polymer or the like may be used.

In the case of forming the projections (pillars) 320 and 343 which are repellent to the solution used for the formation of the interlayer insulating film, the interlayer insulating film is formed so as not to be formed on the projections.

Figure 3A:
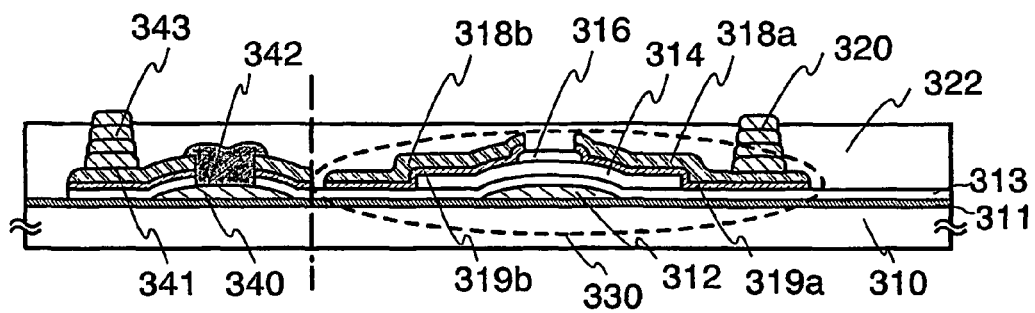
FIGS. 3A to 3D are figures showing Embodiment Mode 3.
Figure 3B:
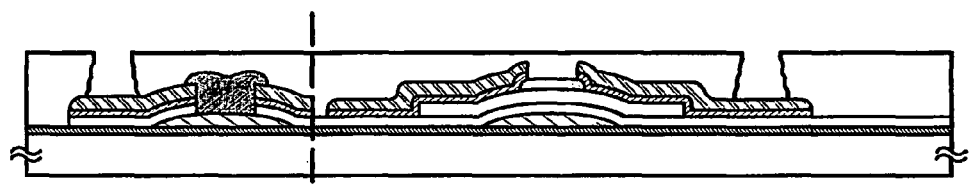

Next, contact holes are formed by removing only the projections (pillars) 320 and 343 (FIG. 3B).

Figure 3C:
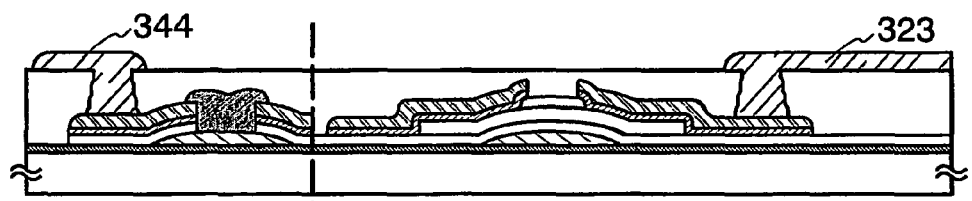

A pixel electrode 323 in contact with the drain wiring 318a is formed (FIG. 3C). Similarly, a terminal electrode 344 in contact with the connection wiring 341 is formed.

In the case of manufacturing a transmissive liquid crystal display panel, a pattern formed of a composition containing indium tin oxide (ITO), indium tin oxide containing silicon oxide (ITSO), zinc oxide (ZnO), tin oxide ($SnO_2$), or the like may be formed by a droplet discharge method, and baked to form the pixel electrode 323 and the terminal electrode 344. In the case of manufacturing a reflective liquid crystal display panel, the pixel electrode 323 and the terminal electrode 344 can be formed of a composition mainly containing particles of a metal such as Ag (silver), Au (gold), Cu (copper), W (tungsten), or Al (aluminum). As another method, a transparent conductive film or a light reflective conductive film is formed by sputtering and a mask pattern is formed by a droplet discharge method; thus, the pixel electrode may be formed by combining etching.

Through the above steps, a TFT substrate for a liquid crystal display panel in which a bottom gate (inverted staggered) TFT and a pixel electrode are formed over a substrate 310 is completed.

Next, an alignment layer 324a is formed so as to cover the pixel electrode 323. The alignment layer 324a may be formed by a droplet discharge method, screen printing, or off-set printing. Subsequently, the surface of the alignment layer 324a is rubbed.

A counter substrate 325 is provided with a color filter formed with a color layer 326a, a light shielding layer (black matrix) 326b, and an over coat layer 327; a counter electrode 328 formed with a transparent electrode; and the alignment layer 324b thereover. Here, a sealant with a closed pattern (not shown) is used since liquid crystal 329 is dropped. Alternatively, dip coating (pumping up method) by which liquid crystal 329 is injected by capillary phenomenon after pasting the TFT substrate and a counter substrate may be employed using a seal pattern having an opening.

Next, liquid crystal 329 is dropped under reduced pressure so as to prevent bubbles from entering, and the TFT substrate and the counter substrate are pasted together. Liquid crystal 329 is dropped once or several times in the closed seal pattern. A twisted nematic (TN) mode is mostly employed as an alignment mode of a liquid crystal. In this mode, the alignment direction of liquid crystal molecules is twisted at 90° according to the polarization of light from its entrance to the exit. In the case of manufacturing a TN liquid crystal display device, an alignment layer is formed on both of the substrates; the substrates are pasted together so that the rubbing directions of the substrates are orthogonalized.

The gap between the pair of the substrates may be maintained by spraying spherical spacers, forming a column spacer formed of resin, or mixing fillers into the sealant. The columnar spacer is formed of an organic resin material containing as a main component at least one material selected from the group consisting of acrylic, polyimide, polyimideamide, and epoxy; any one material of silicon oxide, silicon nitride, and silicon oxynitride; or an inorganic material composed of a stack of these materials.

Next, unnecessary substrate is divided. In the case of obtaining a plurality of panels from one substrate, each panel is separated off. In the case of obtaining one panel from one substrate, the separation step can be skipped by pasting a counter substrate which is previously cut.

Figure 3D:
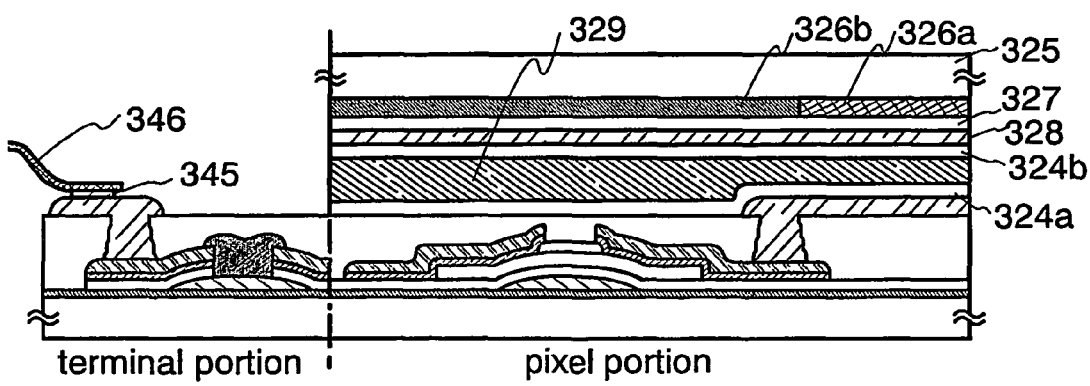

An FPC 346 is bonded to the TFT substrate with an anisotropic conductive layer 345 therebetween by a known method. A liquid crystal module is completed through the above steps (FIG. 3D). Further, an optical film is provided as necessary. In the case of a transmissive liquid crystal display device, polarizers are respectively pasted to both an active matrix substrate and a counter substrate.

As described above, according to this embodiment mode, the light exposure using a photomask is skipped by using a projection (pillar) 343 which is liquid repellent; thus, the process can be simplified and the time of manufacture can be reduced. A liquid crystal display device can be easily manufactured by even using a glass substrate after five generations, one side of which exceeds 1000 mm by forming each kind of pattern directly on a substrate by using a droplet discharge method.

In this embodiment mode, a process in which a light exposure process using a photomask is not carried out; however, a part of patterning may be performed by light exposure using a photomask.

The invention having the above structure will be described in detail using the following embodiments.

Embodiment 1

In this embodiment, an example of manufacturing an active matrix liquid display device using a channel etch TFT will be shown. FIGS. 4A to 4E show a cross section of manufacturing steps.

First, a base film 411, a metal wiring 412, a wiring 440 extending to a terminal area are formed over a substrate 410 according to the steps shown in Embodiment Mode 1. Further, a gate insulating film 413 is formed thereover.

A semiconductor film 414a and an n-type semiconductor film 417 are formed in layers. The semiconductor film 414a is formed with an amorphous semiconductor film or a semi-amorphous semiconductor film which is formed by vapor phase growth or sputtering using a semiconductor material gas typified by silane and germanium. As an amorphous semiconductor film, an amorphous silicon film obtained by PCVD using $SiH_4$ or a gas mixture of $SiH_4$ and $H_2$. Further, as a semiamorphous semiconductor film, a semiconductor film obtained by PCVD using a gas mixture in which $SiH_4$ is diluted 1:3 to 1:1000 in $H_2$, a gas mixture in which $Si_2H_6$ is diluted with $GeF_4$ with a gas flow rate of 20:0.9 to 40:0.9 ($Si_2H_6$:$GeF_4$), or a gas mixture of $SiH_4$ and $H_2$. Note that a semiamorphous silicon film is preferably used since crystallinity can be given to the interface from the base. The n-type semiconductor film 417 may be formed with an amorphous semiconductor film or a semiamorphous semiconductor film formed by PCVD using silane gas and phosphine gas. Note that, the gate insulating film 413, the semiconductor film 414a, and the n-type semiconductor film 417 can be formed continuously without being exposed to the atmosphere. Penetration of impurities can be prevented by avoiding exposure to the atmosphere by PCVD.

Figure 4A:
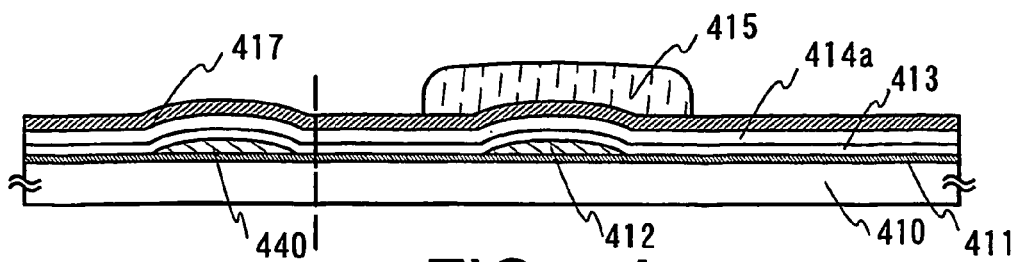
FIGS. 4A to 4E are figures showing manufacturing steps according to Embodiment 1.

Subsequently, a mask 415 for patterning the semiconductor layer is formed by a droplet discharge method (FIG. 4A). A resin material such as an epoxy resin, an acrylic resin, a phenol resin, a novolac resin, a melamine resin, or a urethane resin is used for the mask 415. In using any one of materials, surface tension and viscosity are appropriately controlled by diluting the concentration of a solvent or adding a surfactant or the like.

Next, a semiconductor film 414a except the area covered with the mask 415 and the n-type semiconductor film 417 are removed by dry etching or wet etching, so that a semiconductor layer to be an active layer is formed.

In order to achieve good coverage, a layer formed of an insulating material or a conductive material 416 which covers the edge of the semiconductor layer is formed by a droplet discharge method.

A composition containing a conductive material (such as Ag (silver), Au (gold), Cu (copper), W (tungsten), or Al (aluminum)) is selectively discharged by a droplet discharge method to form a source wiring and a drain wiring 418a and 418b.

Next, a mask used for removing a part of the semiconductor layer which is overlapped with the metal wiring 412 serving as a gate electrode with the gate insulating film 413 therebetween is formed by a droplet discharge method. N-type semiconductor films 419a and 419b are formed by etching concurrently with a semiconductor layer 414b, a part of which has been overlapped with the metal wiring 412 serving as a gate electrode and is removed. Thus, a channel etch TFT 430 is completed.

Figure 4B:
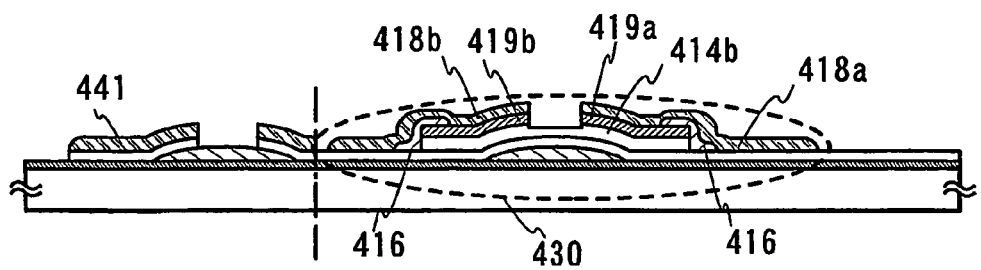

Next, the area except the terminal area is covered with a resin such as a resist by using a shadow mask. In the terminal area, a part of the wiring 440 is exposed by etching a gate insulating film 413 using the connection wiring 441 as a mask (FIG. 4B). A resist mask formed by screen printing may be used as an etching mask instead of the shadow mask.

The rest of the steps may be performed in the similar manner as Embodiment Mode 1. This embodiment has the same structure as Embodiment Mode 1 only except for the TFT structure.

Next, a conductor 442 for connecting the wiring 440 extending to the terminal area and the connection wiring 441 is formed. The conductor 442 may be formed by printing or by a droplet discharge method.

A projection (pillar) 420 formed of a conductive material is formed over a part of the source or drain wiring 418a. A projection (pillar) 443 is also formed over the connection wiring 441 in a similar manner.

Figure 4C:
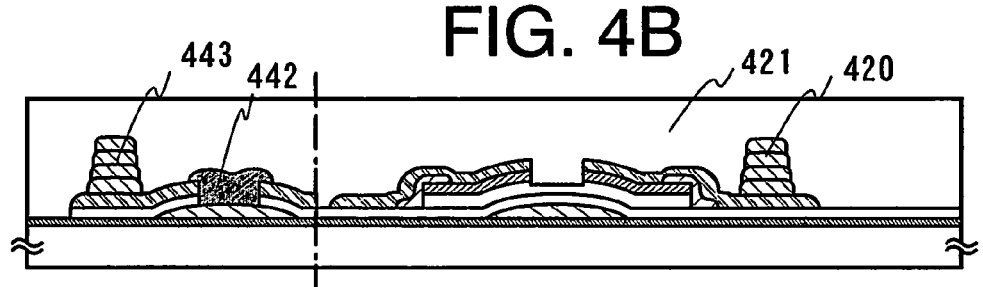

An interlayer insulating film 421 which is flat is formed by coating (FIG. 4C). The interlayer insulating film 421 may be formed with an inorganic insulating film such as a silicon oxide film formed by a vapor phase growth method or sputtering instead of coating. Further, after a silicon nitride film is formed as a protective film by PCVD or sputtering, the interlayer insulating film 421 may be formed by coating.

The interlayer insulating film 421 may be formed by a droplet discharge method. Further, the interlayer insulating film 421 may be formed by a droplet discharge method before final bake of the projections (pillars) 420 and 443; thus, the final bake thereof is carried out simultaneously.

A part of the interlayer insulating film over the projections (pillars) 420 and 443 is removed by etch back of the entire surface, so that the projections (pillars) 420 and 443 are exposed. Alternatively, the interlayer insulating film may be grinded by chemical mechanical polishing (CMP) and thereafter carrying out etch back of the entire surface; thus, the projections (pillars) 420 and 443 can be exposed.

Figure 4D:
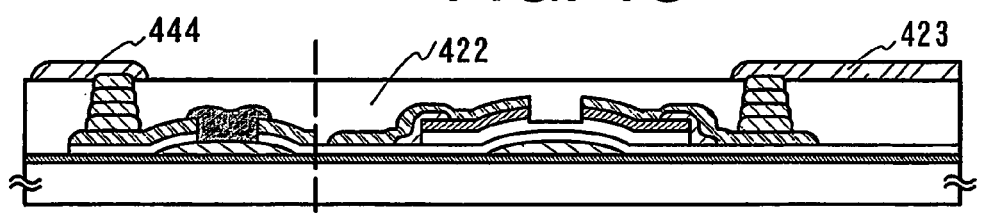

A pixel electrode 423 is formed in contact with the projection (pillar) 420 on an interlayer insulating film 422 which is made flat (FIG. 4D). Similarly, the a terminal electrode 444 in contact with the projection (pillar) 443 is formed. In the case of manufacturing a transmissive liquid crystal display panel, a pattern formed of a composition containing indium tin oxide (ITO), indium tin oxide containing silicon oxide (ITSO), zinc oxide (ZnO), tin oxide ($SnO_2$), or the like may be formed by a droplet discharge method or screen printing, and baked to form the pixel electrode 423 and the terminal electrode 444. In the case of manufacturing a reflective liquid crystal display panel, the pixel electrode 423 and the terminal electrode 444 can be formed of a composition mainly containing particles of a metal such as Ag (silver), Au (gold), Cu (copper), W (tungsten), or Al (aluminum) by a droplet discharge method.

Through the above steps, a TFT substrate for a liquid crystal display panel in which a bottom gate (inverted staggered) TFT and a pixel electrode are formed over a substrate 410 is completed.

Next, an alignment layer 424a is formed so as to cover the pixel electrode 423. The alignment layer 424a may be formed by a droplet discharge method, screen printing, or off-set printing. Subsequently, the surface of the alignment layer 424a is rubbed.

A counter substrate 425 is provided with a color filter formed with a color layer 426a, a light shielding layer (black matrix) 426b, and an over coat layer 427; a counter electrode 428 formed with a transparent electrode; and the alignment layer 424b thereover. In this embodiment, a sealant with a closed pattern (not shown) is used since liquid crystal 429 is dropped. Alternatively, dip coating (pumping up method) by which liquid crystal 429 is injected by capillary phenomenon after pasting the TFT substrate and a counter substrate may be employed using a seal pattern having an opening.

Next, liquid crystal 429 is dropped under reduced pressure so as to prevent bubbles from entering, and the TFT substrate and the counter substrate are pasted together. Liquid crystal is dropped once or several times in the closed seal pattern.

The gap between the pair of the substrates may be maintained by spraying spherical spacers, forming a column spacer formed of resin, or mixing fillers into the sealant.

Next, unnecessary substrate is divided. In the case of obtaining a plurality of panels from one substrate, each panel is separated off. In the case of obtaining one panel from one substrate, the separation step can be skipped by pasting a counter substrate which is previously cut.

Figure 4E:
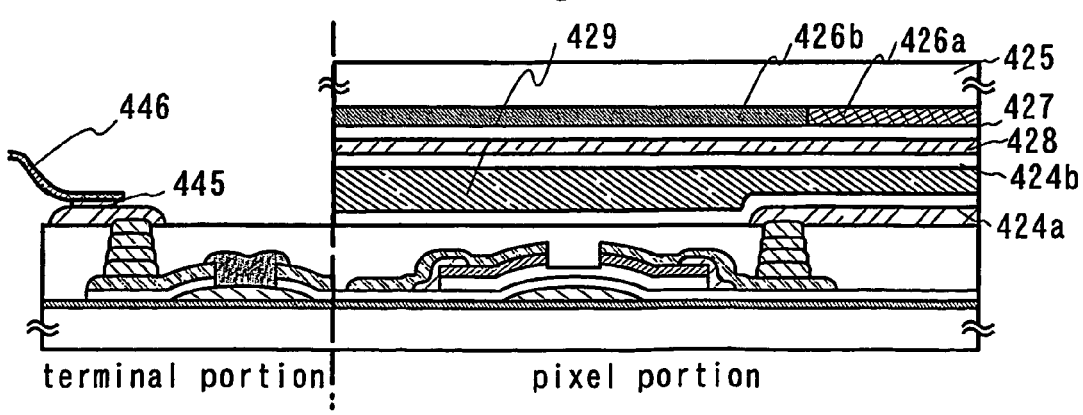

An FPC 446 is bonded to the TFT substrate with an anisotropic conductive layer 445 therebetween by a known method. A liquid crystal module is completed through the above steps (FIG. 4E). Further, an optical film is provided as necessary. In the case of a transmissive liquid crystal display device, polarizers are respectively pasted to both an active matrix substrate and a counter substrate.

In this embodiment, a process in which a light exposure process using a photomask is not carried out; however, a part of patterning may be performed by light exposure using a photomask. For example, if a photomask used in a patterning step of removing a part of the semiconductor film, by which the size of a channel region is determined, the size can be determined finely.

This embodiment can be freely combined with Embodiment Mode 1.

Embodiment 2

Figure 5:
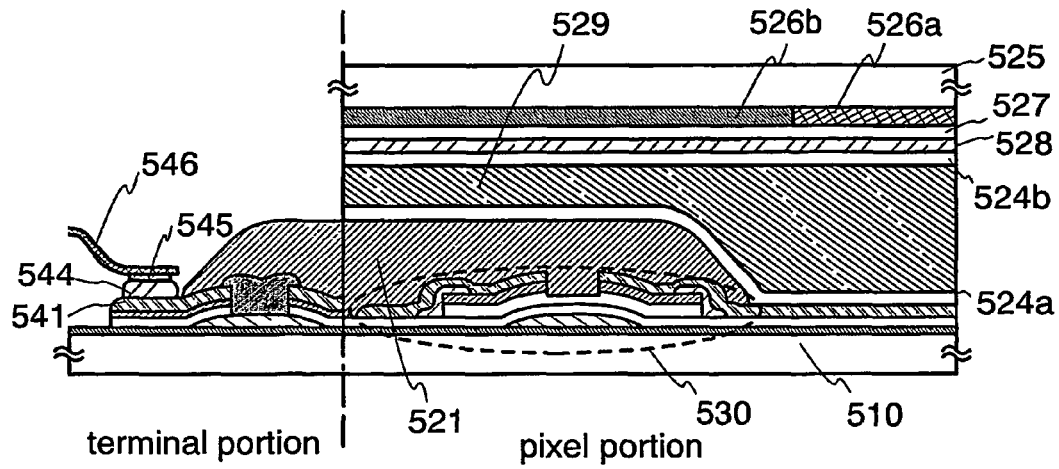
FIG. 5 is a cross-sectional view showing a liquid crystal display device according to Embodiment 2.

In this embodiment, an example of manufacturing an active matrix liquid display device using a channel etch TFT will be shown. FIG. 5 shows a cross section of a liquid crystal display device.

Since this embodiment is similar to Embodiment Mode 2 except that the TFT in Embodiment Mode 2 has a channel stop structure. Accordingly, only simple explanation will be given here.

Further, a channel etch TFT 530 may be formed through the steps according to Embodiment 1. This embodiment includes similar steps to Embodiment 1 except for that a part of a pattern of a drain wiring serves as a pixel electrode (reflective electrode).

An interlayer insulating film 521 is selectively formed by a droplet discharge method as in Embodiment Mode 2. In the pixel area, the interlayer insulating film is formed so as to cover the area except the part later to be a pixel electrode. Droplet discharge and bake may be repeated two or more times to make the interlayer insulating film thick enough. In the terminal area, the interlayer insulating film 221 is provided so as not to cover the part later to be a terminal electrode. Thus, the interlayer insulating film is not provided in the areas where connection is made or the insulating film is not required. Accordingly, the formation of contact holes is redundant.

Next, a terminal electrode 544 in contact with a connection wiring 541 is formed by a droplet discharge method or printing.

Through the above steps, a TFT substrate for a reflective liquid crystal display panel in which a bottom gate (inverted staggered) TFT and a pixel electrode are formed over a substrate 510 is completed.

Since subsequent steps are the same as Embodiment Mode 2, only brief description will be given. An alignment layer 524a is formed so as to cover the pixel electrode. The surface of the alignment layer 526a is rubbed thereafter. A counter substrate 525 is provided with a color filter including a color layer 526a, a light shielding layer 526b, and an over coat layer 527, a counter electrode 528 formed with a transparent electrode, and an alignment layer 524b thereover. A sealant having a closed pattern (not shown) is formed by a droplet discharge method so as to surround the portion which is overlapped with the pixel area. Next, liquid crystal 529 is dropped under reduced pressure so as to prevent bubbles from entering, and the substrates are pasted together. Subsequently, unnecessary part of a substrate is separated. Further, FPC 546 is pasted with an anisotropic conductive layer 545 in between by a known method. A reflective liquid crystal module can be completed through the above steps (FIG. 5).

As described above, according to this embodiment, the light exposure using a photomask is skipped by selectively forming an interlayer insulating film by a droplet discharge method; thus, the process can be simplified and the time of manufacture can be reduced.

In this embodiment, a part of the pattern of the drain wiring serves as a pixel electrode; therefore, a contact between the drain wiring and a pixel electrode is not required to be made, which results in the simplification of the process.

In this embodiment, a process in which a light exposure process using a photomask is not carried out; however, a part of patterning may be performed by light exposure using a photomask. For example, if a photomask used in a patterning step of removing a part of the semiconductor film, by which the size of a channel region is determined, the size can be determined finely.

This embodiment can be freely combined with Embodiment Mode 1, Embodiment Mode 2, or Embodiment 1.

Embodiment 3

Figure 6:
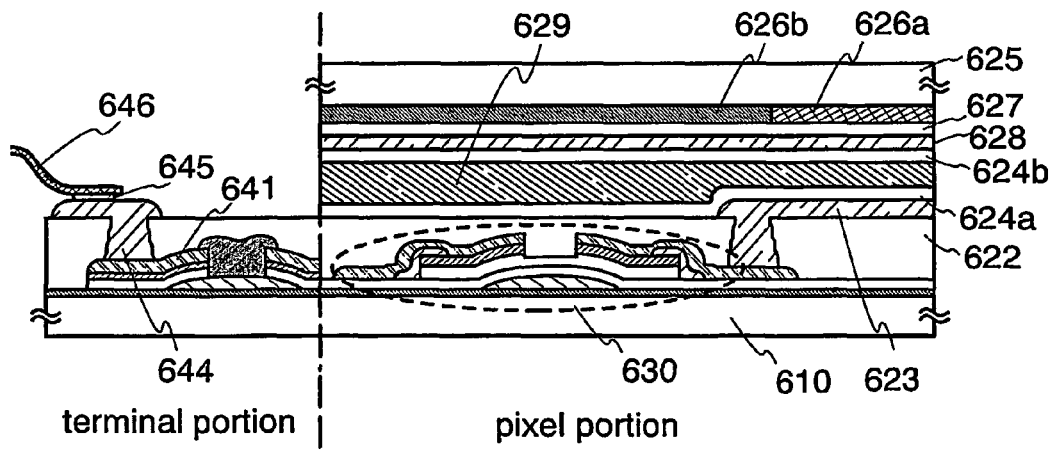
FIG. 6 is a cross-sectional view showing a liquid crystal display device according to Embodiment 3.

In this embodiment, an example of manufacturing an active matrix liquid display device using a channel etch TFT will be shown. FIG. 6 shows a cross section of a liquid crystal display device according to this embodiment.

Since this embodiment is similar to Embodiment Mode 3 except that the TFT in Embodiment Mode 3 has a channel stop structure. Accordingly, only simple explanation will be given here.

Further, a channel etch TFT 630 in this embodiment may be formed through the steps according to Embodiment 1.

After the steps up to the formation of a source or drain wiring has been finished according to Embodiment 1, a projection (pillar) formed of a liquid repellent (water repellent, oil repellent) material is formed over a part of the source or drain wiring by a droplet discharge method as in Embodiment Mode 3.

Next, a flat interlayer insulating film 622 is formed. A flat film may be obtained by using a coating method. Alternatively, the interlayer insulating film 622 may be formed by a droplet discharge method, and minute irregularities on the surface may be planarized with an air knife. As in Embodiment Mode 3, an interlayer insulating film is formed so as not to be formed on the projections which are repellent to the solution used for the formation of the interlayer insulating film. Next, contact holes are formed by removing only the projections. Further, a pixel electrode 623 in contact with a drain wiring is formed. Similarly, a terminal electrode 644 in contact with the connection wiring 641 is formed.

In the case of manufacturing a transmissive liquid crystal display panel, a pattern formed of a composition containing indium tin oxide (ITO), indium tin oxide containing silicon oxide (ITSO), zinc oxide (ZnO), tin oxide ($SnO_2$), or the like may be formed by a droplet discharge method, and baked to form the pixel electrode 623 and the terminal electrode 644.

In the case of manufacturing a reflective liquid crystal display panel, the pixel electrode 623 and the terminal electrode 644 can be formed of a composition mainly containing particles of a metal such as Ag (silver), Au (gold), Cu (copper), W (tungsten), or Al (aluminum). As another method, a transparent conductive film or a light reflective conductive film is formed by sputtering and a mask pattern is formed by a droplet discharge method; thus, the pixel electrode may be formed by combining etching.

Through the above steps, a TFT substrate for a reflective liquid crystal display panel in which a bottom gate (inverted staggered) TFT 630 and a pixel electrode 623 are formed over a substrate 610 is completed.

Since subsequent steps are the same as Embodiment Mode 3, only brief description will be given. An alignment layer 624a is formed so as to cover the pixel electrode. The surface of the alignment layer 626a is rubbed thereafter. A counter substrate 625 is provided with a color filter including a color layer 626a, a light shielding layer 626b, and an over coat layer 627, a counter electrode 628 formed with a transparent electrode, and an alignment layer 624b thereover. A sealant having a closed pattern (not shown) is formed by a droplet discharge method so as to surround the portion which is overlapped with the pixel area. Next, liquid crystal 629 is dropped under reduced pressure so as to prevent bubbles from entering, and the substrates are pasted together. Subsequently, unnecessary part of a substrate is separated. Further, FPC 646 is pasted with an anisotropic conductive layer 645 in between by a known method. A liquid crystal module can be completed through the above steps (FIG. 6).

As described above, according to this embodiment mode, the light exposure using a photomask is skipped by using a projection (pillar) which is liquid repellent; thus, the process can be simplified and the time of manufacture can be reduced.

In this embodiment, a process in which a light exposure process using a photomask is not carried out; however, a part of patterning may be performed by light exposure using a photomask. For example, if a photomask used in a patterning step of removing a part of the semiconductor film, by which the size of a channel region is determined, the size can be determined finely.

This embodiment can be freely combined with Embodiment Mode 1, Embodiment Mode 3, or Embodiment 1.

Embodiment 4

Figure 7:
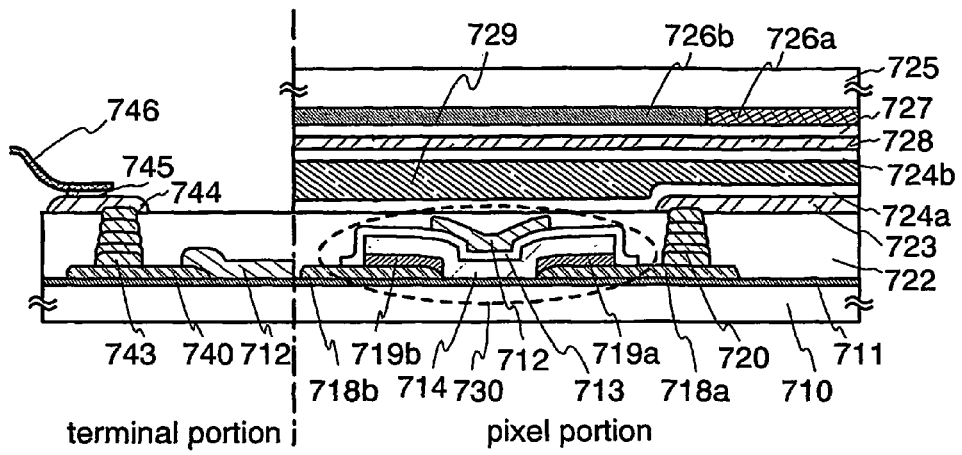
FIG. 7 is a cross-sectional view showing a liquid crystal display device according to Embodiment 4.

In this embodiment, a method for manufacturing an active matrix liquid crystal display device using a staggered TFT manufactured by a droplet discharge method as a switching element. FIG. 7 shows a cross sectional structure of a liquid crystal display device according to this embodiment.

First, a base film 711 for improving adhesion with a material layer to be later formed by a droplet discharge method is formed over a substrate 710. The base film 711 may be formed thin; accordingly, it can be regarded as base pretreatment. A photocatalyst (titanium oxide ($TiO_2$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), tungsten oxide ($WO_3$)) may be applied with a spray; alternatively, an organic material (polyimide, acryl, or a material having a skeletal structure including a bond of silicon (Si) and oxygen (O) which contains at least one of the group consisting of hydrogen, fluorine, alkyl group and aromatic hydrocarbon as a substituent) may be selectively applied by ink-jet method or sol-gel process.

Source and drain wirings 718a a d 718b are formed over the base film 711 by a droplet discharge method. Father, a terminal electrode is formed in the terminal area. As the materials for forming those layers, a composition mainly containing particles of a metal such as gold (Au), silver (Ag), copper (Cu), platinum (Pt), palladium (Pd), tungsten (W), nickel (Ni), tantalum (Ta), bismuth (Bi), lead (Pb), indium (In), tin (Sn), zinc (Zn), titanium (Ti), or aluminum (Al) may be used. In particular, the source and drain wirings are preferable to be low resistance. Therefore, a material in which any one of gold, silver, or copper dissolved or dispersed in a solvent is preferably used, and more preferably silver or copper with low resistance is used in consideration of a specific resistance value. However, in the case of using silver or copper, a barrier film may be additionally provided for an impurity measure. A solvent corresponds to ester such as butyl acetate, alcohols such as isopropyl alcohol, an organic solvent such as acetone, or the like. Surface tension and viscosity are appropriately adjusted by adjusting density of a solvent and adding a surfactant or the like. Further, a base layer may be formed as in Embodiment Mode 1.

Subsequently, after an n-type semiconductor layer is formed over the entire surface, a part of the n-type semiconductor layer between source and drain wirings 718a and 718b is removed by etching.

Next, a semiconductor film is formed over the entire surface. The semiconductor film is formed with an amorphous semiconductor film or a semiamorphous semiconductor film which is formed by vapor phase growth or sputtering using a semiconductor material gas typified by silane and germanium.

Next, a mask is formed by a droplet discharge method, and the semiconductor film and the n-type semiconductor layer are patterned; thus, a semiconductor layer 714 and n-type semiconductor layers 719a and 719b shown in FIG. 7 are formed. The semiconductor layer 714 is formed so as to cover both the source and drain wirings 718a and 718b. The n-type semiconductor layers 719a and 719b are interposed between the source and drain wirings 718a and 718b.

A gate insulating film is formed with a single layer or layered structure by plasma CVD or sputtering. As a preferable form in particular, a gate insulating film may be formed with a stack of three layers of an insulating layer formed of silicon nitride, an insulating layer formed of silicon oxide, and an insulating layer formed of silicon nitride.

Next, a mask is formed by a droplet discharge method, thereby patterning the gate insulating film 713.

Next, a gate wiring 712 is formed by a droplet discharge method. As a conductive material for forming the gate wiring 712, a composition mainly containing particles of a metal such as Ag (silver), Au (gold), Cu (copper), W (tungsten), or Al (aluminum) can be used. The gate wiring 712 extended to a terminal area is formed so as to be in contact with a corresponding terminal electrode 740 in the terminal area.

A projection (pillar) 720 formed of a conductive material is formed over a part of the source and drain wirings 718a and 718b. A stack is formed by repeating discharging and baking of a composition containing a conductive material (such as Ag (silver), Au (gold), Cu (copper), W (tungsten), or Al (aluminum)), so that the projection (pillar) 720 is formed. A projection (pillar) 743 is also formed over the terminal electrode 740 in a similar manner.

An interlayer insulating film which is flat is formed by coating. The interlayer insulating film may be formed with an inorganic insulating film such as a silicon oxide film formed by a vapor phase growth method or sputtering instead of coating. Further, after a silicon nitride film is formed as a protective film by PCVD or sputtering, the interlayer insulating film may be formed by coating.

Further, the interlayer insulating film may be formed by a droplet discharge method before final bake of the projections (pillars) 720 and 743; thus, the final bake thereof is carried out simultaneously.

Parts of the interlayer insulating film over the projections (pillars) 720 and 743 are removed by etch back of the entire surface, so that the projections (pillars) 720 and 743 are exposed. Alternatively, the interlayer insulating film may be grinded by chemical mechanical polishing (CMP) and thereafter carrying out etch back of the entire surface; thus, the projections (pillars) 720 and 743 can be exposed.

A pixel electrode 723 in contact with the projection (pillar) 720 is formed over an interlayer insulating film 722. A terminal electrode 744 in contact with the projection (pillar) 743 is similarly formed.

Through the above steps, a TFT substrate for a liquid crystal display panel in which a bottom gate (inverted staggered) TFT 713 and a pixel electrode 723 are formed over a substrate 710 is completed.

Since subsequent steps are the same as Embodiment Mode 1, only brief description will be given. An alignment layer 724a is formed so as to cover the pixel electrode 723. The surface of the alignment layer 726a is rubbed thereafter. A counter substrate 725 is provided with a color filter including a color layer 726a, a light shielding layer 726b, and an over coat layer 727, a counter electrode 728 formed with a transparent electrode, and an alignment layer 724b thereover. A sealant having a closed pattern (not shown) is formed by a droplet discharge method so as to surround the portion which is overlapped with the pixel area. Next, liquid crystal 729 is dropped under reduced pressure so as to prevent bubbles from entering, and the substrates are pasted together. Subsequently, unnecessary part of a substrate is separated. Further, FPC 746 is pasted to a terminal electrode 744 with an anisotropic conductive layer 745 in between by a known method. A reflective liquid crystal module can be completed through the above steps (FIG. 7).

In this embodiment, a process in which a light exposure process using a photomask is not carried out; however, a part of patterning may be performed by light exposure using a photomask.

Further, this embodiment can be freely combined with Embodiment Mode 1.

Embodiment 5

Figure 8:
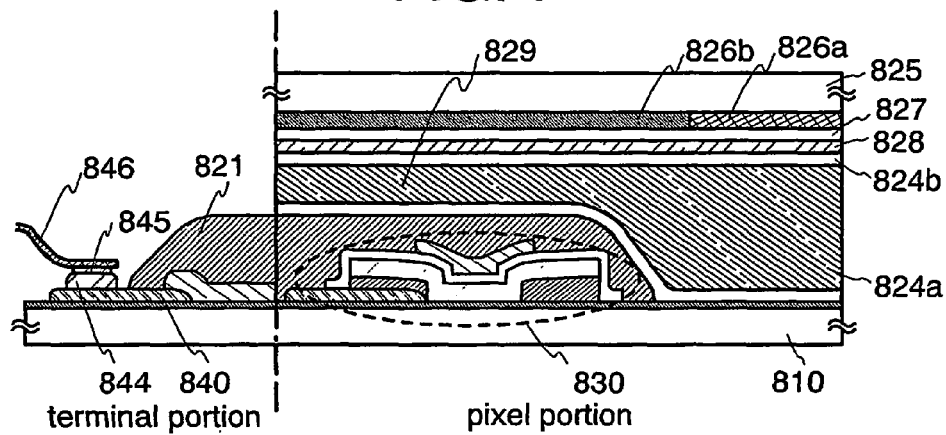
FIG. 8 is a cross-sectional view showing a liquid crystal display device according to Embodiment 5.

In this embodiment, an example of manufacturing an active matrix liquid display device using a channel stop TFT will be shown. FIG. 8 shows a cross section of a liquid crystal display device according to this embodiment.

Since this embodiment is similar to Embodiment Mode 2 except that the TFT in Embodiment Mode 2 has a channel stop structure. Accordingly, only simple explanation will be given here.

Further, an inverted TFT 830 may be formed through the steps according to Embodiment 4. This embodiment includes similar steps to Embodiment 4 except for that a part of a pattern of a drain wiring serves as a pixel electrode (reflective electrode).

Next, an interlayer insulating film 821 is selectively formed by a droplet discharge method as in Embodiment Mode 2. In the pixel area, the interlayer insulating film is formed so as to cover the area except the part later to be a pixel electrode. Droplet discharge and bake may be repeated two or more times to make the interlayer insulating film thick enough. In the terminal area, the interlayer insulating film 821 is provided so as not to cover the part later to be a terminal electrode. Thus, the interlayer insulating film is not provided in the areas where connection is made or the insulating film is not required. Accordingly, the formation of contact holes is redundant.

Next, a terminal electrode 844 in contact with a connection wiring 840 is formed by a droplet discharge method or printing.

Through the above steps, a TFT substrate for a reflective liquid crystal display panel in which a top gate (staggered) TFT and a pixel electrode are formed over a substrate 810 is completed.

Since subsequent steps are the same as Embodiment Mode 2, only brief description will be given. An alignment layer 824a is formed so as to cover the pixel electrode. The surface of the alignment layer 826a is rubbed thereafter. A counter substrate 825 is provided with a color filter including a color layer 826a, a light shielding layer 826b, and an over coat layer 827, a counter electrode 828 formed with a transparent electrode, and an alignment layer 824b thereover. A sealant having a closed pattern (not shown) is formed by a droplet discharge method so as to surround the portion which is overlapped with the pixel area. Next, liquid crystal 829 is dropped under reduced pressure so as to prevent bubbles from entering, and the substrates are pasted together. Subsequently, unnecessary part of a substrate is separated. Further, FPC 846 is pasted with an anisotropic conductive layer 845 in between by a known method. A reflective liquid crystal module can be completed through the above steps (FIG. 8).

As described above, according to this embodiment, the light exposure using a photomask is skipped by selectively forming an interlayer insulating film by a droplet discharge method; thus, the process can be simplified and the time of manufacture can be reduced.

In this embodiment, a part of the pattern of the drain wiring serves as a pixel electrode; therefore, a contact between the drain wiring and a pixel electrode is not required to be made, which results in the simplification of the process This embodiment can be freely combined with Embodiment Mode 1, Embodiment Mode 2, or Embodiment 4.

Embodiment 6

Figure 9:
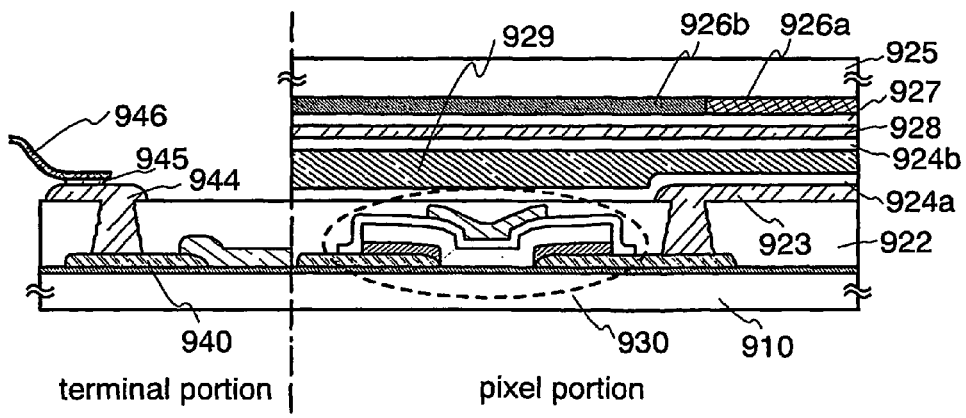
FIG. 9 is a cross-sectional view showing a liquid crystal display device according to Embodiment 6.

In this embodiment, an example of manufacturing an active matrix liquid display device using a staggered TFT will be shown. FIG. 9 shows a cross section of a liquid crystal display device according to this embodiment.

Since this embodiment is similar to Embodiment Mode 3 except that the TFT in Embodiment Mode 3 has a channel stop structure. Accordingly, only simple explanation will be given here.

Further, a channel etch TFT 930 in this embodiment may be formed through the steps according to Embodiment 4.

After the steps up to the formation of a gate wiring has been finished according to Embodiment 4, a projection (pillar) formed of a liquid repellent (water repellent, oil repellent) material is formed over a part of the source or drain wiring by a droplet discharge method as in Embodiment Mode 3.

Next, a flat interlayer insulating film 922 is formed. A flat film may be obtained by using a coating method. Alternatively, the interlayer insulating film 622 may be formed by a droplet discharge method, and minute irregularities on the surface may be planarized with an air knife. As in Embodiment Mode 3, an interlayer insulating film is formed so as not to be formed on the projections which are repellent to the solution used for the formation of the interlayer insulating film. Next, contact holes are formed by removing only the projections. Further, a pixel electrode 923 in contact with a drain wiring is formed. Similarly, a terminal electrode 944 in contact with the connection wiring 940 is formed.

In the case of manufacturing a transmissive liquid crystal display panel, a pattern formed of a composition containing indium tin oxide (ITO), indium tin oxide containing silicon oxide (ITSO), zinc oxide (ZnO), tin oxide ($SnO_2$), or the like may be formed by a droplet discharge method, and baked to form the pixel electrode 923 and the terminal electrode 944.

In the case of manufacturing a reflective liquid crystal display panel, the pixel electrode 923 and the terminal electrode 944 can be formed of a composition mainly containing particles of a metal such as Ag (silver), Au (gold), Cu (copper), W (tungsten), or Al (aluminum). As another method, a transparent conductive film or a light reflective conductive film is formed by sputtering and a mask pattern is formed by a droplet discharge method; thus, the pixel electrode may be formed by combining etching.

Through the above steps, a TFT substrate for a liquid crystal display panel in which a top gate (staggered) TFT 930 and a pixel electrode 923 are formed over a substrate 910 is completed.

Since subsequent steps are the same as Embodiment Mode 3, only brief description will be given. An alignment layer 924a is formed so as to cover the pixel electrode 923. The surface of the alignment layer 926a is rubbed thereafter. A counter substrate 925 is provided with a color filter including a color layer 926a, a light shielding layer 926b, and an over coat layer 927, a counter electrode 928 formed with a transparent electrode, and an alignment layer 924b thereover. A sealant having a closed pattern (not shown) is formed by a droplet discharge method so as to surround the portion which is overlapped with the pixel area. Next, liquid crystal 929 is dropped under reduced pressure so as to prevent bubbles from entering, and the substrates are pasted together. Subsequently, unnecessary part of a substrate is separated. Further, FPC 946 is pasted with an anisotropic conductive layer 945 in between by a known method. A liquid crystal module can be completed through the above steps (FIG. 9).

As described above, according to this embodiment, the light exposure using a photomask is skipped by using a liquid repellent projection (pillar); thus, the process can be simplified and the time of manufacture can be reduced.

In this embodiment, a process in which a light exposure process using a photomask is not carried out; however, a part of patterning may be performed by light exposure using a photomask.

This embodiment can be freely combined with Embodiment Mode 1, Embodiment Mode 3, or Embodiment Mode 4.

Embodiment 7

In this embodiment, an example in which liquid crystal application is performed by a droplet discharge method. In this embodiment, an example of obtaining four panels from one large area substrate 110 is shown in FIGS. 11A to 11D.

Figure 11A:
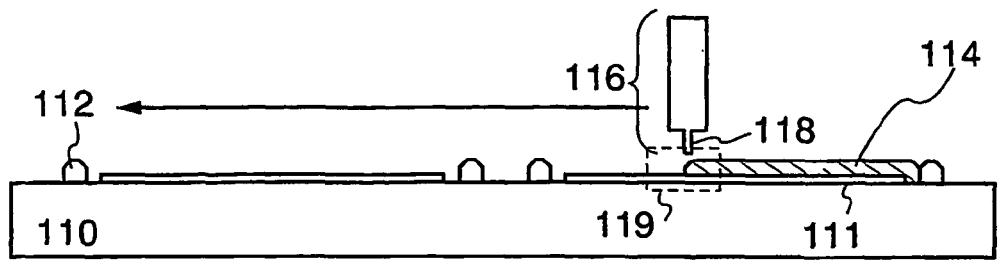
FIGS. 11A to 11D show a perspective view and cross-sectional views showing liquid crystal application by a droplet discharge method. (Embodiment 7)

FIG. 11A shows a cross section of a liquid crystal layer being formed by ink-jet method. A liquid crystal material 114 is discharged, sprayed, or dripped from a nozzle 118 of an ink-jet system 116 so as to cover a pixel area 111 that is surrounded by a sealant 112. The ink-jet system 116 is moved to the direction of the arrow in FIG. 11A. Note that, the nozzle 118 is moved here; however, the liquid crystal layer may be formed by moving the substrate while the nozzle is fixed.

Figure 11B:
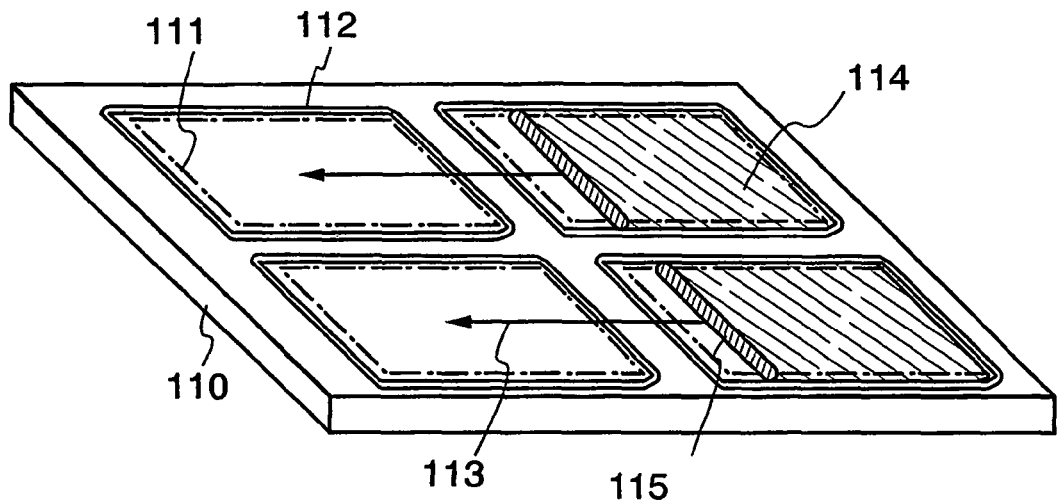

FIG. 11B shows a perspective view. The liquid crystal material 114 is selectively discharged, sprayed, or dripped only over the area surrounded by the sealant 112, and an object surface 115 is moved correspondingly to a nozzle scan direction 113.

Figure 11C:
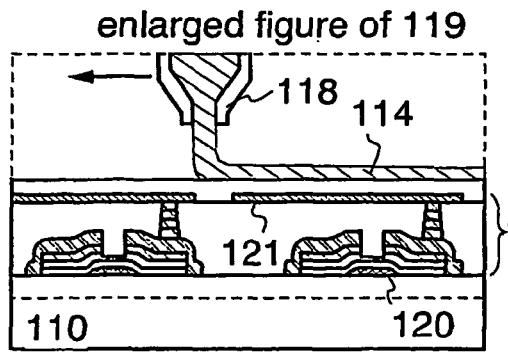
Figure 11D:
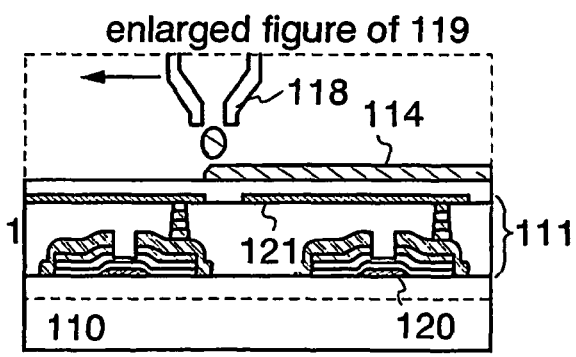

FIGS. 11C and 11D show enlarged cross sections of an area 119 surrounded by a dotted line in FIG. 11A. When the liquid crystal material 114 has high viscosity, it is discharged continuously and applied in a manner where each droplet of the liquid crystal material is joined to one another. On the other hand, when the viscosity of the liquid crystal material 114 has low viscosity, it is discharged intermittently and the droplets are dripped as shown in FIG. 11D.

In FIG. 11C, reference numeral 120 denotes an inversely staggered TFT and reference numeral 121 denotes a pixel electrode. The pixel area 111 is formed from a pixel electrode arranged in matrix; a switching element being connected to the pixel electrode, an inversely staggered TFT is used here; and a storage capacitor (not illustrated).

The workflow of manufacturing a panel will be described below with reference to FIGS. 12A to 12D.

Figure 12A:
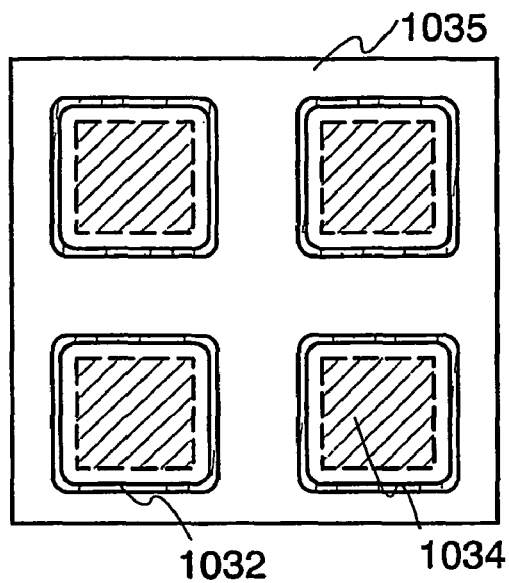
FIGS. 12A to 12D are top views showing a process. (Embodiment 7)
Figure 12B:
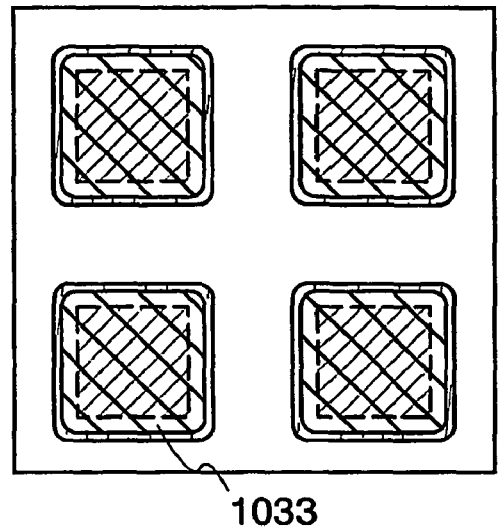

First, the first substrate 1035 in which a pixel area 1034 is formed over its insulating surface is prepared. The first substrate 1035 is pretreated with the following steps: forming an alignment layer, rubbing, dispersing spherical spacers, forming a column spacer, forming a color filter, or the like. Subsequently, a sealant 1032 is formed on a predetermined position (a pattern surrounding the pixel area 1034) with a dispenser or an ink-jet system over the first substrate 1035 in an inert atmosphere or under reduced pressure, as shown in FIG. 12A. A material containing fillers (diameter of 6 μm to 24 μm), which has a viscosity of 40 Pa·s to 400 Pa·s, is used for the sealant 1032 that is translucent. Note that, it is preferable to select a sealant that is insoluble in a liquid crystal 1033 to be in contact therewith. A photo cured acrylic resin or a thermosetting acrylic resin may be used for the sealant 1032. Further, the sealant 1032 can be formed by printing due to its simple seal pattern.

Subsequently, a liquid crystal 1033 is applied to an area surrounded by the sealant 1032 by ink-jet method. A known liquid crystal material with the viscosity that allows discharging by ink-jet method may be used for the liquid crystal 1033. Further, it is suitable to apply a liquid crystal by ink-jet method since the viscosity of a liquid crystal material can be controlled by adjusting the temperature. The required amount of the liquid crystal 1033 can be stored in the area surrounded by the sealant 1032 without a loss.

Figure 12C:
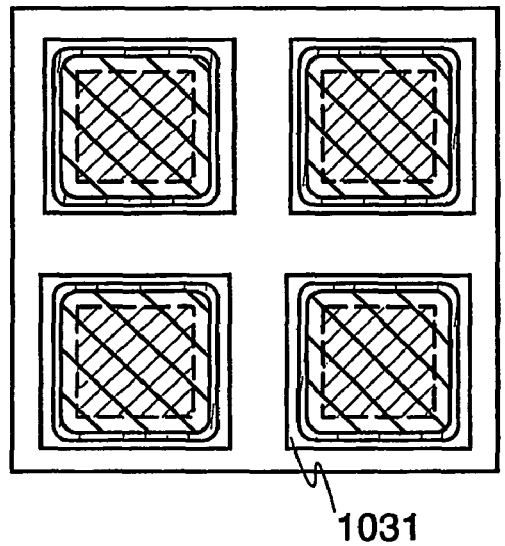

The first substrate 1035 provided with a pixel area 1034 and the second substrate 1031 provided with a counter electrode and an alignment layer are pasted together under reduced pressure without bubbles being mixed in (FIG. 12C). The sealant 1032 is cured here by heat-treating or applying an ultra-violet ray while the substrates are pasted together. Note that, heat treatment may be carried out in addition to ultra-violet irradiation.

Figure 13A:
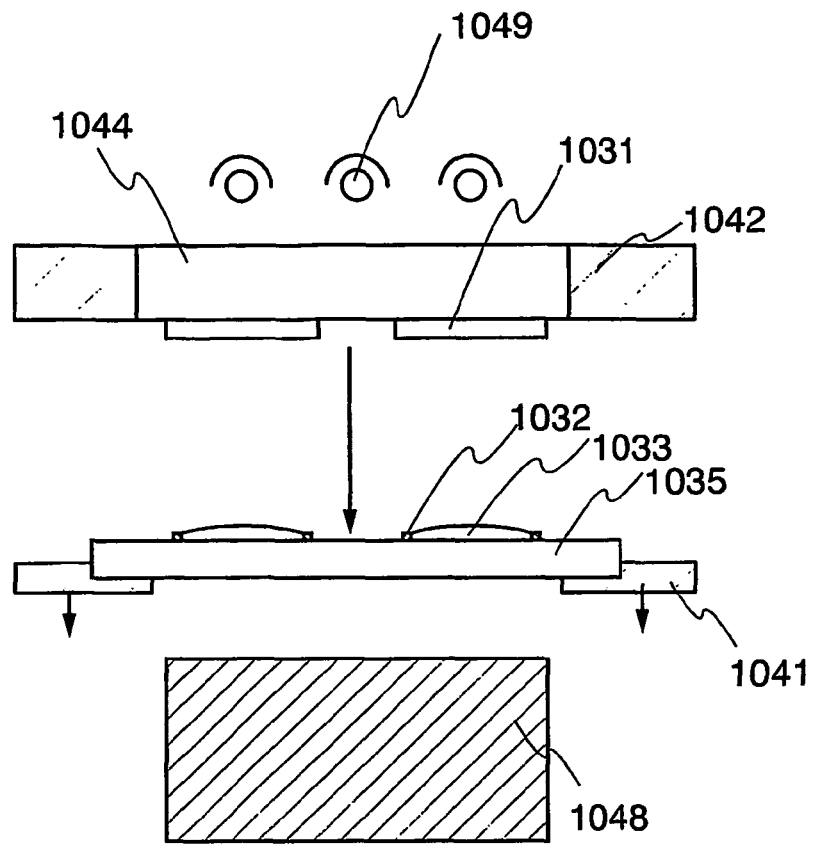
FIGS. 13A and 13B show cross-sectional views each showing a pasting device and a pasting process. (Embodiment 7)
Figure 13B:
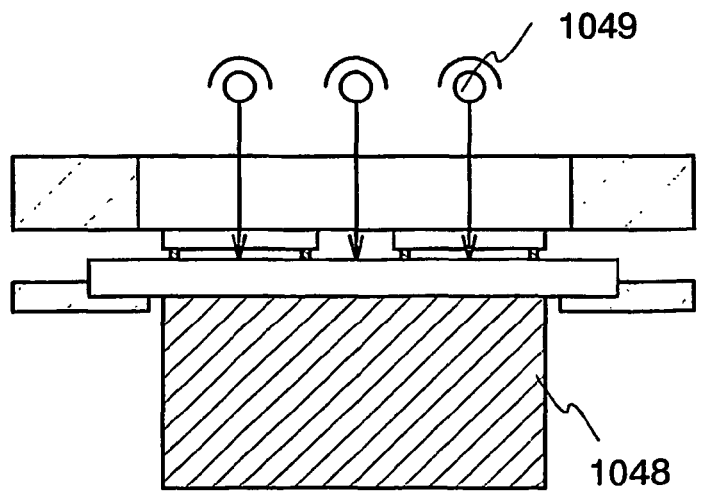

FIGS. 13A and 13B show an example of a pasting device that is capable of ultra-violet irradiation or heat treatment while or after substrates are pasted.

In FIGS. 13A and 13B, reference numeral 1041 denotes the first substrate holder, reference numeral 1042 denotes the second substrate holder, reference numeral 1044 denotes a window, reference numeral 1048 denotes a downside measuring plate, and reference numeral 1049 denotes a light source. Note that, the same reference numerals in FIGS. 12A to 12D are used for the corresponding parts in FIGS. 13A and 13B.

The bottom downside measuring plate 1048 includes a heater, which cures a sealant. ]The second substrate holder 1042 is provided with the window 1044, so that ultra-violet light or the like from the light source 1049 can transmit therethrough. Although it is not illustrated here, an alignment of a position of the first substrate is performed through the window 1044. The second substrate 1031 that is to be a counter substrate is severed into a desirable size, and fixed to the second substrate holder 1042 with a vacuum chuck or the like. FIG. 13A shows a state before pasting.

On the occasion of pasting, after the first and second substrate holders 1041 and 1042 are lowered, the fist substrate 1035 and the second substrate 1031 are pasted together, and ultra-violet light is applied to cure the sealant in the state unchanged where the substrates are pasted together. A state after pasting is shown in FIG. 13B.

Figure 12D:
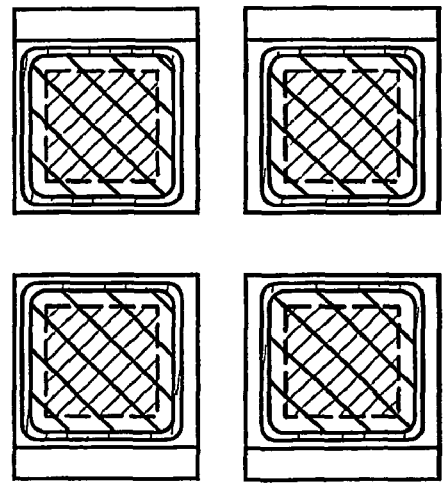

Next, the first substrate 1035 is cut by means of a cutting machine such as a scriber, a breaker, or a circular saw (FIG. 12D). Thus, four panels can be manufactured from one substrate. Further, an FPC is pasted by a known method.

Figure 14A:
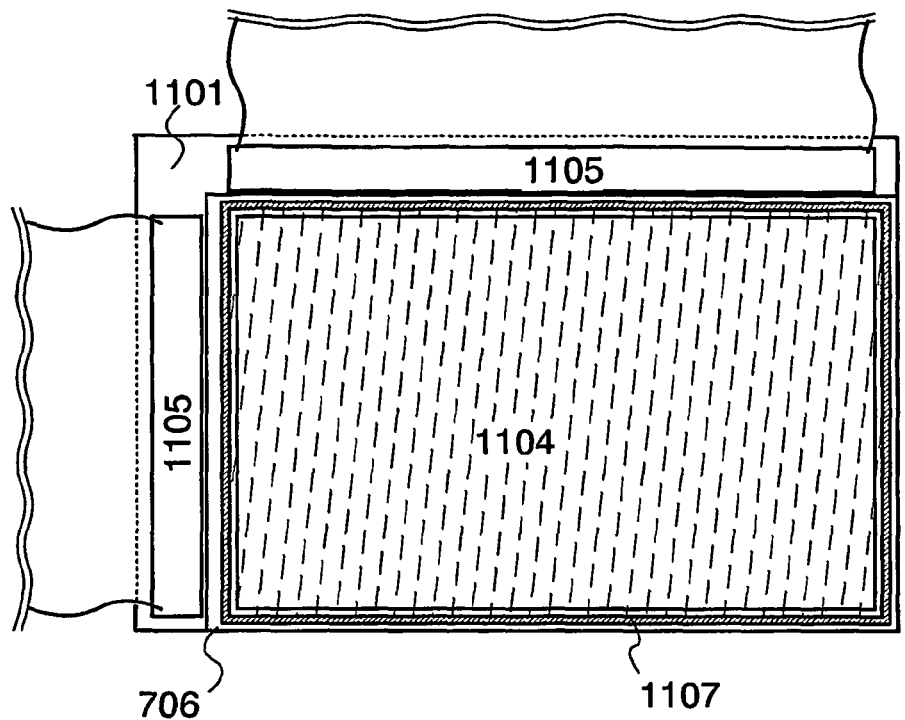
FIGS. 14A and 14B each shows a top view of a liquid crystal module. (Embodiment 7)
Figure 14B:
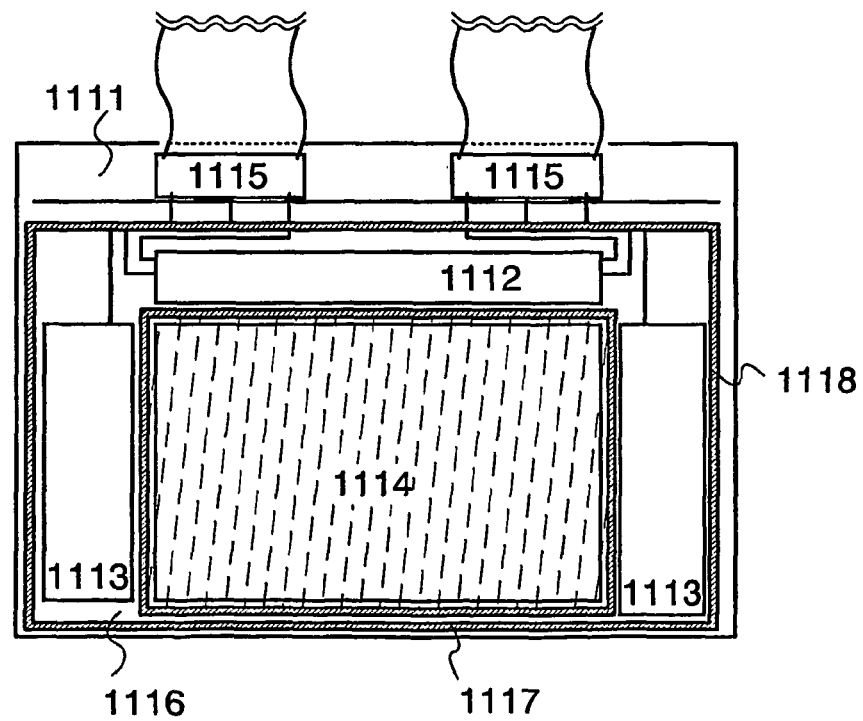

Note that, the first substrate 1035 and the second substrate 1031 can be formed from a glass substrate, a quartz substrate, or a plastic substrate A top view of a liquid crystal module obtained through the above steps is shown in FIG. 14A. A top view of another liquid crystal module is shown in FIG. 14B.

A TFT in which an active layer contains an amorphous semiconductor film has low field-effect mobility of around 1 cm$^2$/Vsec. Therefore, a driver circuit for displaying an image is formed with an IC chip, and is mounted in TAB (Tape Automated Bonding) or COG (Chip On Glass).

In FIG. 14A, reference numeral 1101 denotes an active matrix substrate, reference numeral 1106 denotes a counter substrate, reference numeral 704 denotes a pixel area, and reference numeral 1105 denotes an FPC. Note that, liquid crystal is discharged under reduced pressure by ink-jet method, and a pair of substrates 1101 and 1106 are pasted together with the sealant 1107.

In the case where a TFT including an active layer formed with a semiamorphous silicon film is used, a part of a driver circuit may be formed with the TFT, thereby fabricating a liquid crystal module shown in FIG. 11B. Note that a driver circuit which cannot be formed with a TFT including an active layer formed with a semiamorphous silicon film includes an IC chip (not shown).

In FIG. 14B, reference numeral 1111 denotes an active matrix substrate, reference numeral 1116 denotes a counter substrate, reference numeral 1112 denotes a source signal line driver circuit, reference numeral 1113 denotes a gate signal line driver circuit, reference numeral 1114 denotes a pixel area, reference numeral 1117 denotes the first seal material, and reference numeral 1115 denotes an FPC. Note that, a liquid crystal is discharged under reduced pressure by ink-jet method, and a pair of substrates 1111 and 1116 are pasted together with the first seal material 1117 and the second seal material. Since a liquid crystal is not necessary in the driver circuits 1112 and 1113, a liquid crystal is retained only in the pixel area 1114. The second seal material 1118 is provided to reinforce the whole panel.

A liquid crystal module obtained is provided with a backlight 1204 and an optical waveguide 1205. An active matrix liquid crystal display device (transmissive type) is completed by covering the liquid crystal module with a cover 1206. A part of the cross section thereof is shown in FIG. 6. Note that, the cover and the liquid crystal module are fixed with an adhesive or an organic resin. The polarizing film 1203 is pasted to each of the active matrix substrate and the counter substrate, since the liquid crystal display device is a transmissive type.

Figure 15:
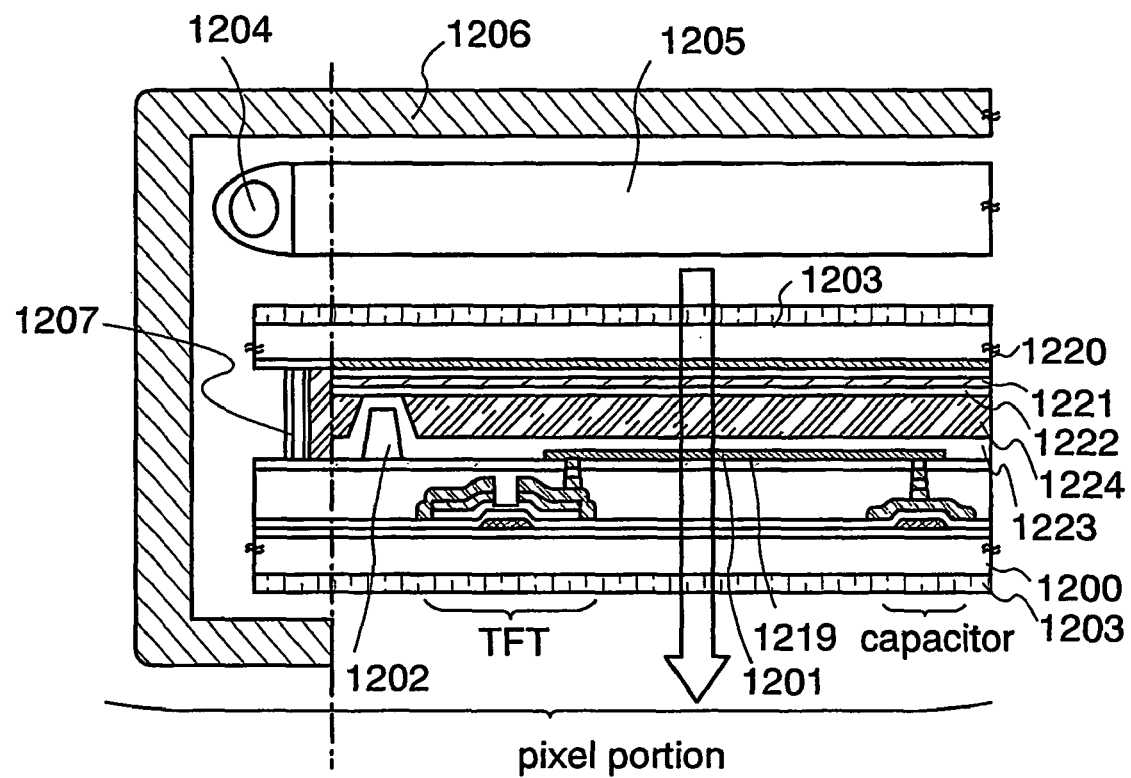
FIG. 15 is a cross-sectional view showing an active matrix liquid crystal display device. (Embodiment 7)

In FIG. 15, reference numeral 1200 denotes a substrate, 1201 denotes a pixel electrode, 1202 denotes a columnar spacer, 1207 denotes a sealant, 1220 denotes a color filter which is provided with a color layer and a light shielding film correspondingly to each pixel, 1221 denotes a counter electrode, 1222 and 1223 denote alignment layers, 1224 denotes a liquid crystal layer, and 1219 denotes a protective film.

This embodiment can be freely combined with any one of Embodiment Modes 1 to 3 and Embodiments 1 to 6.

Embodiment 8

Figure 16A:
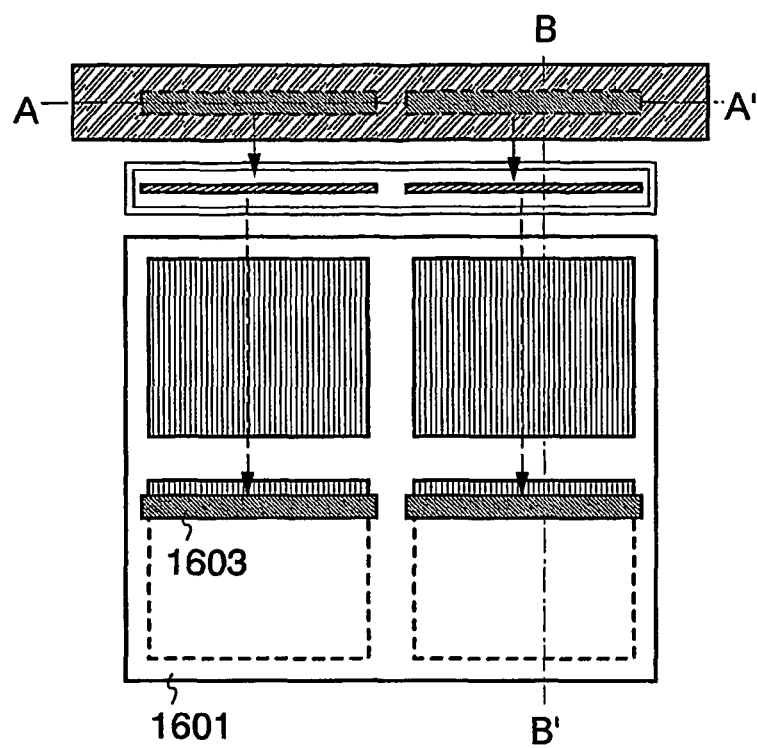
FIGS. 16A to 16C show a droplet discharge system. (Embodiment 8)
Figure 16B:
Figure 16C:
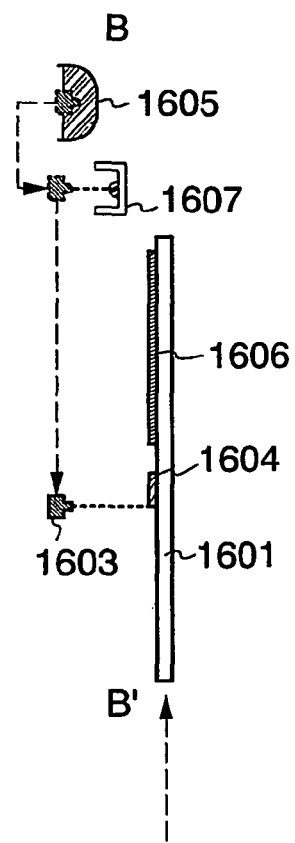

In this embodiment, an example of a system for droplet discharge is shown in FIG. 16A to 16C. FIG. 16A is a top view. FIG. 16B shows a cross-sectional view along A-A' in FIG. 16A. FIG. 16C shows a cross-sectional view along B-B' in FIG. 16A.

In FIG. 16A, reference numeral 1601 denotes a substrate, a thin film transistor, a pixel electrode, and the like are formed thereover. The substrate 1601 is secured to the substrate stage (not shown). In transferring the substrate, the substrate is moved in the direction of the arrow.

A head 1603 of the droplet discharge system is moved above the surface of the substrate 1601, and a solution containing a composition (material for forming a metal wiring or an insulating layer) is discharged. The substrate is relatively scanned by moving the head 1603. The head 1603 is soaked in a solution in a container 1605 to avoid the clogging. Before scanning, the droplet size and the like are stabled by discharging on a test stage 1067. When stable droplets are obtained, the head is moved over to the substrate to discharge.

Alternatively, the head 1603 may be fixed and the substrate 1601 may be moved for scanning. Solvent of discharged compositions 1604 and 1606 is volatilized (baked) to form the desired pattern (a metal wiring, an insulating layer, a mask, and the like).

Here, the entire surface is coated by simply scanning the parallel two heads 1603 once. However, the head 1603 may be shuttled more than once to repeat coating.

Further, an example of providing the container 1605 containing a solution and the test stage 1607 is shown here; however, droplets may be discharged into the container 1605 until the droplets are stabled without using the test stage 1607.

Figure 17:
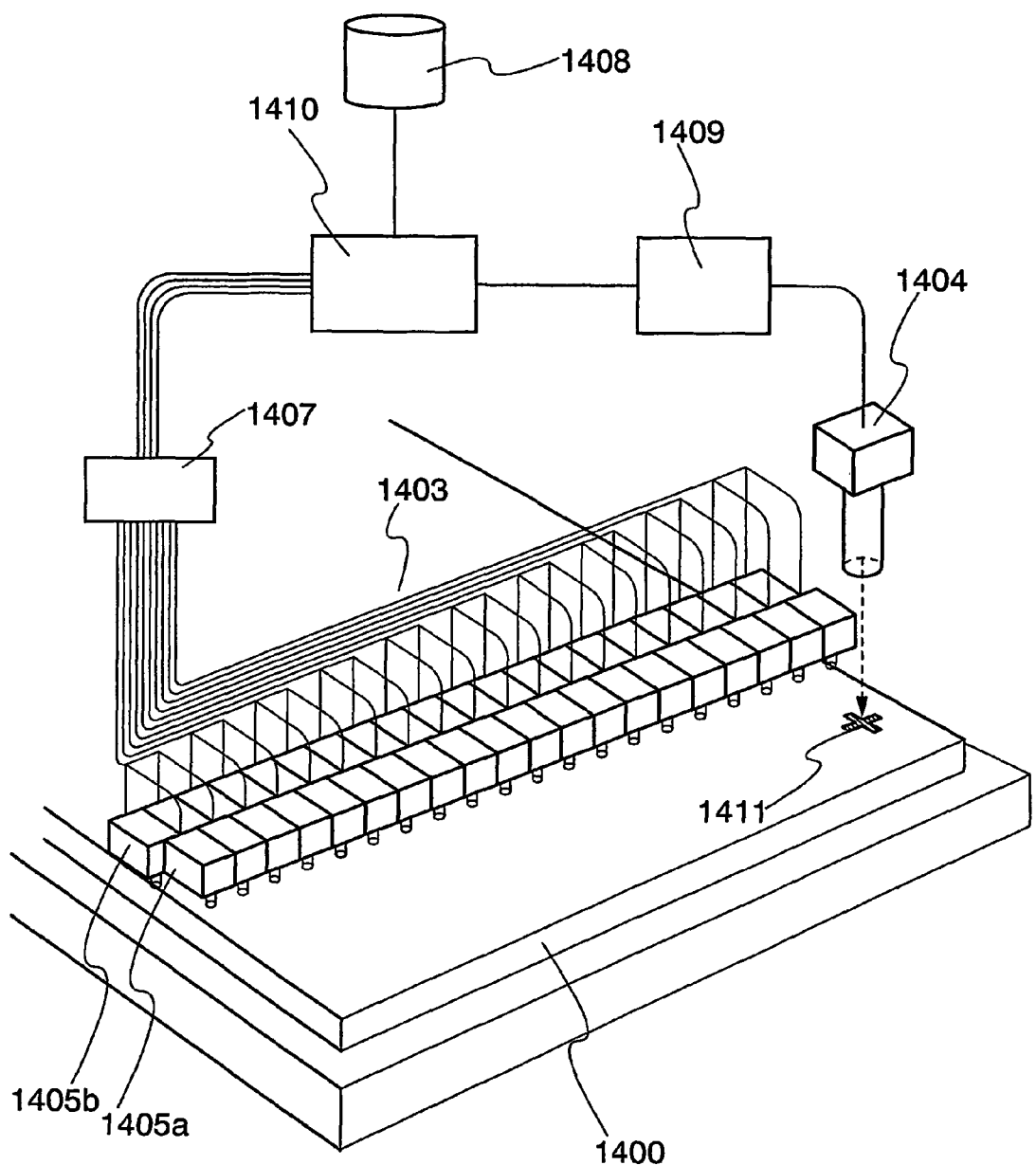
FIG. 17 is a figure showing a droplet discharge system. (Embodiment 8)

FIG. 17 shows an example of nozzles and a control system of a droplet discharge system.

Each head 1405a and 1405b of a droplet discharge means 1403 is connected to a control means 1407, and the heads are controlled by a computer 1410; thus, a preprogrammed pattern can be applied. The pattern may be applied based on a marker 1411 formed on a substrate 1400. Alternatively, the edge of the substrate 1400 may be the base. Such base is detected by an imaging means 1409 such as a CCD, and the information is converted into a digital signal by an image processing means 1409. The converted digital signal is recognized by a computer and a control signal is generated and sent to a control means 1407. The information of the pattern to be formed on the substrate 1400 is stored in a storage medium 1408, and a control signal is sent to the control means 1407 based on the information. Thus, each of heads 1405a and 1405b of the droplet discharge means 1403 is individually controlled.

FIG. 17 shows an example in which the heads 1405a and 1405b are arranged in two lines perpendicular to the scanning direction. Meanwhile, FIG. 18 shows an example in which heads are arranged in three lines perpendicular to the scanning direction in order to deal with a large substrate.

Figure 18:
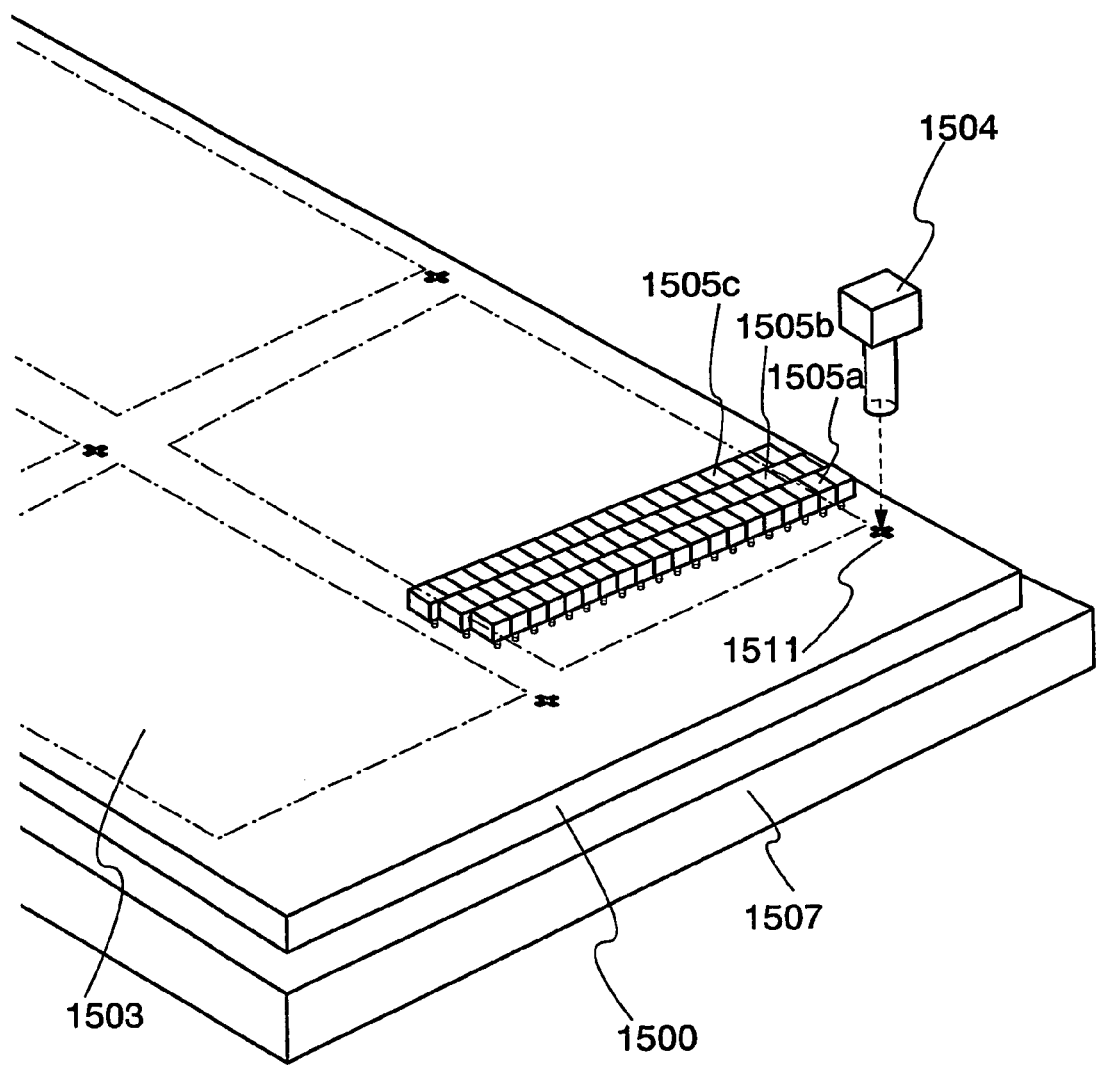
FIG. 18 is a figure showing a droplet discharge system. (Embodiment 8)

In FIG. 18, reference numeral 1500 denotes a large substrate, 1504 denotes an imaging means, 1507 denotes a stage, 1511 denotes a marker, and 1503 denotes an area where a panel is to be formed. A pattern of a material layer is formed by zigzagging or reciprocating heads 1505a, 1505b, and 1505c having the same width as a panel.

In FIG. 18, heads 1505a, 1505b, and 1505c arranged in three lines perpendicular to the scanning direction may discharge different materials for respective material layers, or may discharge one material. When one material is discharged from the three heads to form an interlayer insulating film to have a pattern, the throughput is improved.

As to the system shown in FIG. 18, scanning may be performed by moving a substrate 1500 while a head is fixed, or moving a head while the substrate 1500 is fixed.

This embodiment can be freely combined with any one of Embodiment Modes 1 to 3 and Embodiments 1 to 7.

Embodiment 9

Figure 19A:
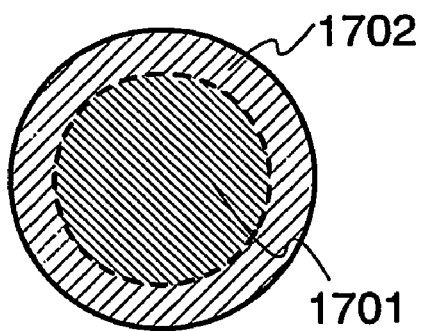
FIGS. 19A and 19B are cross-sectional views of metal particles. (Embodiment 9)
Figure 19B:
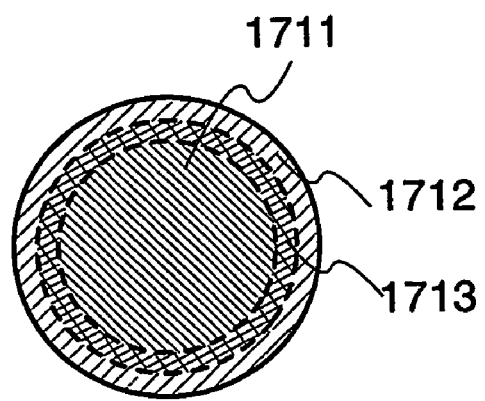

In this embodiment, examples of each metal particle for forming a metal wiring are shown in FIGS. 19A and 19B. The metal particle is dispersed or dissolved in a solvent; thus, a metal wiring can be formed by a droplet discharge method.

A metal particle shown in FIG. 19A includes copper (Cu) component 1701 and silver (Ag) component 1702. Copper is coated by silver; thus, adhesion can be improved in the case of forming a base film or performing base pretreatment. Further, the irregular surface of copper can be made smooth by coating with silver.

A metal particle shown in FIG. 19B includes copper (Cu) component 1711, silver (Ag) component 1712, and NiB is provided therebetween as a buffer layer 1713. The buffer layer 1713 is provided in order to improve adhesion between the copper (Cu) component and the silver (Ag) component.

This embodiment can be freely combined with any one of Embodiment Modes 1 to 3 and Embodiments 1 to 8.

Embodiment 10

In FIG. 20, a mode of electroplating is shown, and the case of obtaining four panels from a large mother glass substrate will be described.

Figure 20A:
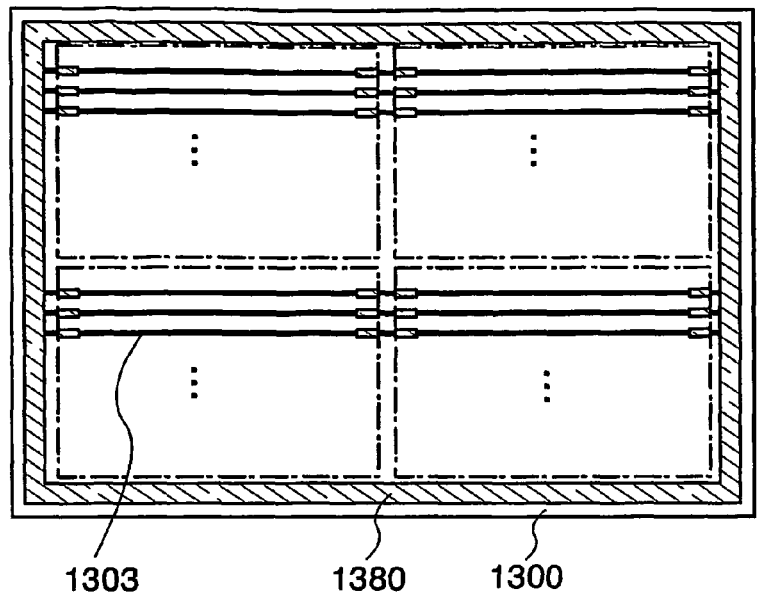
FIGS. 20A to 20C each show a plating machine. (Embodiment 10)

As shown in FIG. 20A, Ag is applied, for example, by ink-jet method in the same level as the gate electrode 1303 to form a conductive film 1380 for supplying current. The conductive film 1380 may be formed of a material different from the gate electrode or may be formed of Cu to be treated with electroplating. Hereupon, Cu may preferably be applied on a gate electrode formed of Ag. Consequently, Cu can be formed uniformly by plating.

Figure 20B:
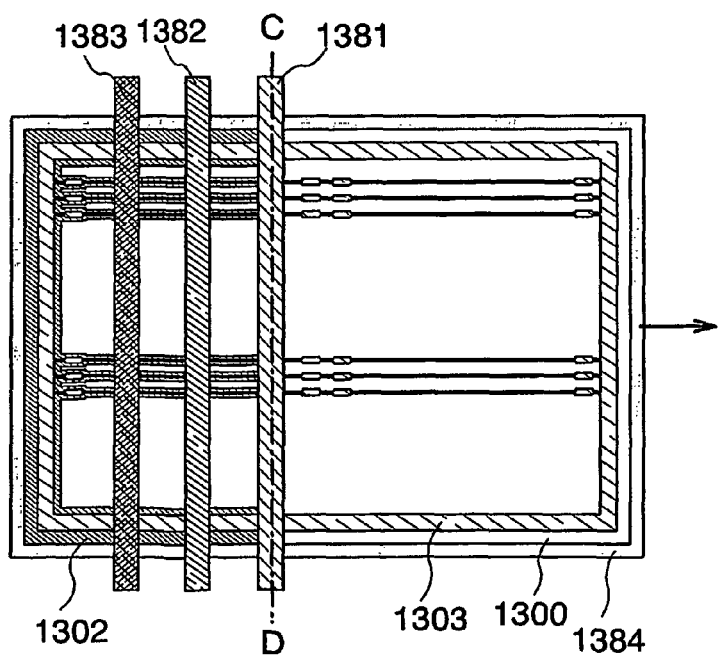

As shown in FIG. 20B, the substrate 1300 is secured to a stage 1384, and a head 1381 for applying a solution in which metal is dissolved, a head 1382 for washing the solution in which the metal is dissolved, and a head 1383 for spraying a drying gas are sequentially disposed above the substrate. By thus arranging a plurality of nozzles, consecutive treatment can be achieved and throughput can be improved. In the case of applying Cu by electroplating, a solution containing copper sulfate and dilute sulfuric acid can be used as the solution in which the metal is dissolved. Oxygen, nitrogen, or the mixture thereof may be used as the drying gas. Further, hot gas may be sprayed for accelerating drying.

In this state, the substrate 1300 is moved in the direction of the arrow, and electroplating can be performed on the large mother glass substrate. The substrate 1300 and the heads 1381, 1382, and 1383 may be moved relatively.

In the case of applying Cu by electroplating, Cu is provided so as to coat silver by plating. Since silver is an expensive material, the manufacturing cost can be reduced by thus carrying out copper plating. Further, in the case of manufacturing a large liquid crystal panel, the wiring resistance can be reduced by thus carrying out copper plating.

In the case of carrying out copper plating, the copper plated wiring is preferably coated with silicon nitride or NiB as a barrier layer.

Figure 20C:
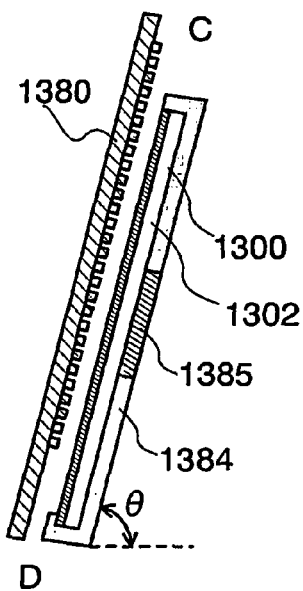

As shown in FIG. 20C, the substrate 1300 is secured to the stage 1384 and arranged slantingly to have an angle of θ. The angle θ may range $0°<θ<90°$, preferably, $45°<θ<80°$. Further, the solution may be sprayed from the head 1381 with high pressure at an angle ranging $90°<θ<120°$. Similarly, washing water is sprayed from the head 1382, and the gas is sprayed from the head 1383 with high pressure. In this case, the solution drops without flowing on the substrate 1300; accordingly, unevenness of the solution can be avoided. Since the substrate is disposed slantingly as above, the plating machine is prevented from being larger even the mother glass substrate is larger.

Further, the stage 1384 includes conductors and an insulator 1385. One of the conductors serves as an anode and the other serves as a cathode. Plating may be performed by flowing current to them. The stage 1384 may be provided with conductors and an insulator separately.

The plated wiring has a continuous pattern; however, an unnecessary part of the pattern is preferably removed. For example, the pattern is cut into each wiring in dividing the substrate into each panel.

Plating may be performed by dipping the substrate 1300 in a solution in which metal is dissolved.

Further, a conductive film 1302 may be formed around the gate electrode by electroless plating which does not require current flow due to reduction of metal ions in the solution. In this case, the conductive film 1380 used for flowing current is unnecessary.

This embodiment can be freely combined with Embodiment Mode 1, Embodiment Mode 2, Embodiment Mode 3, or any one of Embodiments 1 through 9.

Embodiment 11

A liquid crystal display device and an electronic device of the present invention include a video camera, a digital camera, a goggle type display (head mounted display), a navigation system, an audio reproducing device (a car audio, an audio component, and the like), a laptop computer, a game machine, a portable information terminal (a mobile computer, a cellular phone, a portable game machine, an electronic book, or the like), an image reproducing device (specifically a device capable of producing a recording medium such as a Digital Versatile Disc (DVD) and having a display device that can display the image) and the like. Especially, it is preferable to apply the invention to a large-sized television with a large screen or the like. Specific examples of the electronic devices are shown in FIGS. 21A to 21C.

Figure 21A:
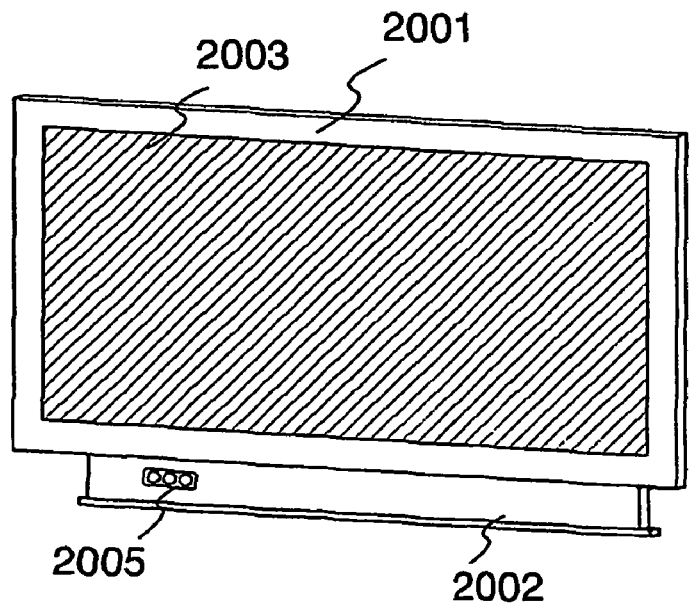
FIGS. 21A to 21C are figures showing examples of electronic devices. (Embodiment 11)

FIG. 21A is a large-sized display device with a large screen of 22 inches to 50 inches, which includes a chassis 2001, a support 2002, a display area 2003, and a video input terminal 2005. The display device includes every display devices for displaying information for a personal computer, for a TV broadcast reception, and the like. A large area display device which is relatively inexpensive can be acquired even when a large substrate after five generations, which has a side exceeding 1000 mm is used.

Figure 21B:
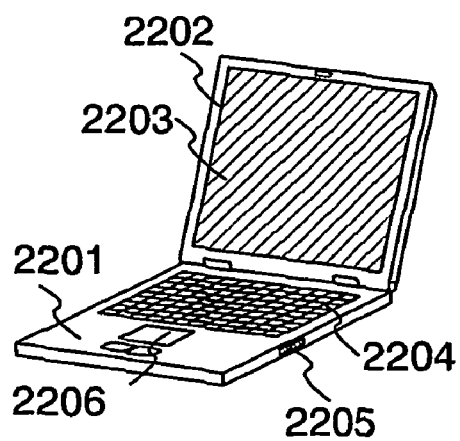

FIG. 21B is a notebook personal computer, which includes a main body 2201, a chassis 2202, a display area 2203, a keyboard 2204, an external connection port 2205, a pointing mouse 2206, and the like. A notebook personal computer which is relatively inexpensive can be acquired according to the invention.

Figure 21C:
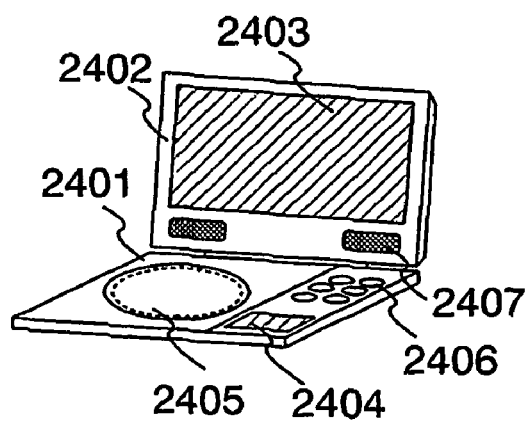

FIG. 21C is a portable image reproduction device equipped with a recording medium (specifically, a DVD player), which includes a main body 2401, a chassis 2402, a display area A 2403, a display area B 2404, a recording medium (a DVD players and the like) reading portion 2405, operation keys 2406, speaker portions 2407, and the like. The display area A 2403 mainly displays image information whereas the display area B 2404 mainly displays text information. The image reproduction device equipped with a recording medium includes home video game machines and the like. An image reproduction device which is relatively inexpensive can be acquired according to the invention.

As described above, a liquid crystal display device manufactured according to the invention can be applied to a display area of any electronic device. Any liquid crystal display device manufactured using a structure according to any one of Embodiment Modes 1 through 3, and Embodiments 1 through 8 can be used for the electronic device of the embodiment.

This embodiment can be freely combined with Embodiment Mode 1, Embodiment Mode 2, Embodiment Mode 3, or any one of Embodiments 1 through 10.

Since a plurality of main steps are carried out by a droplet discharge method; thus, the manufacturing cost of a manufacturing apparatus can be reduced.

According to the invention, a material layer can be patterned without using a photomask; therefore, the material efficiency is improved. Further, the manufacturing process can be simplified by skipping the steps of exposure and development in manufacturing a liquid crystal display device. Still further, a liquid crystal display device can be easily manufactured even when a glass substrate after five generations, one side of which exceeds 1000 mm is used.

EXPLANATION OF REFERENCE 10 a substrate; 11 a base film; 12 a metal wiring; 13 a gate insulating film; 14a a semiconductor film; 14b a semiconductor layer; 15 a mask; 16 an insulating layer; 17 an n-type semiconductor film; 18a a source or drain wiring; 18b a source or drain wiring; 19a a source or drain region; 19b a source or drain region; 20 a projection; 21 an interlayer insulating film; 22 an interlayer insulating film; 23 a pixel electrode; 24a an alignment layer; 24b an alignment layer; 25 a counter substrate; 26a a color layer; 26b a light shielding layer; 27 an overcoat layer; 28 a counter electrode; 29 liquid crystal; 30 a TFT; 31 a capacitor wiring; 40 a wiring; 41 a connection wiring; 42 a conductor; 43 a projection; 44 a terminal electrode; 45 an anisotropic conductive layer; 46 an FPC; 110 a large substrate; 111 a pixel area; 112 a sealant; 113 a nozzle operating direction; 114 a liquid crystal material; 115 an application surface; 116 a droplet discharge system; 118 a nozzle; 119 an area surrounded with dotted lines; 120 an inverted staggered TFT; 121 a pixel electrode; 210 a substrate; 211 a base film; 213 a gate insulating film; 214a a semiconductor film; 214b a semiconductor layer; 215 a mask; 216 an insulating layer; 217 an n-type semiconductor film; 218a a source or drain wiring; 218b a source or drain wiring; 219a a source or drain region; 219b a source or drain region; 221 an interlayer insulating film; 224a an alignment layer; 224b an alignment layer; 225 a counter substrate; 226a a color layer; 226b a light shielding layer; 227 an overcoat layer; 228 a counter electrode; 229 liquid crystal; 230 a TFT; 240 a wiring; 241 a connection wiring; 242 a conductor; 244 a terminal electrode; 245 an anisotropic conductive layer; 246 an FPC; 310 a substrate; 314 a semiconductor layer; 316 an insulating layer; 318a a source or drain wiring; 318b a source or drain wiring; 319a a source or drain region; 319b a source or drain region; 320 a projection; 322 an interlayer insulating film; 323 a pixel electrode; 324a an alignment layer; 324b an alignment layer; 325 a counter substrate; 326a a color layer; 326b a light shielding layer; 327 an overcoat layer; 328 a counter electrode; 329 liquid crystal; 330 a TFT; 340 a wiring; 341 a connection wiring; 342 a conductor; 343 a projection; 344 a terminal electrode; 345 an anisotropic conductive layer; 346 an FPC; 410 a substrate; 411 a base film; 412 a metal wiring; 413 a gate insulating film; 414a a semiconductor film; 414b a semiconductor layer; 415 a mask; 416 a layer formed of an insulating material or a conductive material; 417 an n-type semiconductor film; 418a a source or drain wiring; 418b a source or drain wiring; 419a an n-type semiconductor film; 419b an n-type semiconductor film; 420 a projection; 421 an interlayer insulating film; 422 an interlayer insulating film; 423 a pixel electrode; 424a an alignment layer; 424b an alignment layer; 425 a counter substrate; 426a a color layer; 426b a light shielding layer; 427 a overcoat layer; 428 a counter electrode; 429 liquid crystal; 430 a TFT; 440 a wiring; 441 a connection wiring; 442 a conductor; 443 a projection; 444 a terminal electrode; 445 an anisotropic conductive layer; 446 an FPC; 510 a substrate; 521 an interlayer insulating film; 524a an alignment layer; 524b an alignment layer; 525 a counter substrate; 526a a color layer; 526b a light shielding layer; 527 an overcoat layer; 528 a counter electrode; 529 liquid crystal; 530 a TFT; 544 a terminal electrode; 545 an anisotropic conductive layer; 546 an FPC; 610 a substrate; 622 an interlayer insulating film; 623 a pixel electrode; 624a an alignment layer; 624b an alignment layer; 625 a counter substrate; 626a a color layer; 626b a light shielding layer; 627 an overcoat layer; 628 a counter electrode; 629 liquid crystal; 630 a TFT; 641 a connection wiring; 644 a terminal electrode; 645 an anisotropic conductive layer; 646 an FPC; 706 a counter substrate; 710 a substrate; 711 a base film; 712 a gate wiring; 713 a gate insulating layer; 714 a semiconductor layer; 718a a source or drain wiring; 718b a source or drain wiring; 719a an n-type semiconductor layer; 719b an n-type semiconductor layer; 720 a projection; 722 an interlayer insulating film; 723 a pixel electrode; 724a an alignment layer; 724b an alignment layer; 725 a counter substrates; 726a a color layer; 726b a light shielding layer; 727 an overcoat layer; 728 a counter electrode; 729 liquid crystal; 730 a TFT; 740 a terminal electrode; 743 a projection; 744 a terminal electrode; 745 an anisotropic conductive layer; 746 an FPC; 824a an alignment layer; 824b an alignment layer; 825 a counter substrate; 826a a color layer; 826b a light shielding layer; 827 an overcoat layer; 828 a counter electrode; 829 liquid crystal; 830 a TFT; 840 a connection wiring; 844 a terminal electrode; 845 an anisotropic conductive layer; 846 an FPC; 924a an alignment layer; 924b an alignment layer; 925 a counter substrate; 926a a color layer; 926b a light shielding layer; 927 an overcoat layer; 928 a counter electrode; 929 liquid crystal; 930 a TFT; 940 a connection wiring; 944 a terminal electrode; 945 an anisotropic conductive layer; 946 an FPC; 1031 a second substrate; 1032 a sealant; 1033 liquid crystal; 1034 a pixel area; 1035 a first substrate; 1041 a first substrate holder; 1042 a second substrate holder; 1044 a window; 1048 bottom plate; 1049 a light source; 1101 a substrate; 1104 a pixel area; 1105 an FPC; 1107 a sealant; 1111 a substrate; 1112 a source signal line driver circuit; 1113 a gate signal line driver circuit; 1114 a pixel area; 1115 an FPC; 1116 a counter substrate; 1117 a first sealant; 1118 a second sealant; 1200 a substrate; 1201 a pixel electrode; 1202 a spacer; 1203 a polarizer; 1204 a backlight; 1205 an optical waveguide; 1206 a cover; 1207 a sealant; 1219 a protective film; 1220 a color filter; 1221 a counter electrode; 1222 an alignment layer; 1223 an alignment layer; 1224 a liquid crystal layer; 1300 a substrate; 1302 a conductive film; 1303 a gate electrode; 1380 a conductive film; 1381 a head; 1382 a head; 1383 a head; 1384 a stage; 1385 a stage; 1400 a substrate; 1403 a droplet discharge means; 1404 an imaging means; 1405a a head; 1405b a head; 1407 a control means; 1408 a storage medium; 1409 an image processing means; 1410 a computer; 1411 a marker; 1500 a large substrate; 1503 an area; 1504 an imaging means; 1505a a head; 1505b a head; 1505c a head; 1507 a stage; 1511 a marker; 1601 a substrate; 1603 a head portions; 1604 a composition; 1605 solvent container; 1606 a composition; 1607 a test stage; 1701 copper; 1702 silver; 1711 copper; 1712 silver; 1713 a buffer layer; 2001 a chassis; 2002 a support; 2003 a display area; 2005 a video input terminal; 2201 a main body; 2202 a chassis; 2203 a display area; 2204 a keyboard; 2205 an external connection port; 2206 a pointing mouse; 2401 a main body; 2402 a chassis; 2403 a display area A; 2404 a display area B; 2405 a recording medium reading part; 2406 an operation key; 2407 a speaker unit

The invention claimed is:

1. A liquid crystal display device comprising:
a substrate;
a base film comprising a photocatalyst formed over the substrate;
a thin film transistor formed over the base film;
a projection comprising a conductive material formed over at least one of a drain electrode and a source electrode of the thin film transistor;
an interlayer insulating film formed over the thin film transistor; and
a pixel electrode connected to the projection,
wherein the interlayer insulating film is interposed between the base film and the pixel electrode,
wherein the projection has a stacked structure including a plurality of conductors and
wherein each of the plurality of conductors is in direct contact with the interlayer insulating film.

2. The liquid crystal display device according to claim 1, wherein the projection has a tapered shape.

3. The liquid crystal display device according to claim 1, wherein a part of a surface of the base film has a hydrophilic property.

4. The liquid crystal display device according to claim 1, wherein the base film contains one selected from the group consisting of titanium oxide, strontium titanate, cadmium selenide, potassium tantalate, cadmium sulfide, zirconium oxide, niobium oxide, zinc oxide, iron oxide, tungsten oxide.

5. The liquid crystal display device according to claim 1, wherein the base film is doped with a transition metal.

6. The liquid crystal display device according to claim 1, wherein at least one of a gate electrode of the thin film transistor contains one selected from the group consisting of gold, silver, copper, platinum, palladium, tungsten, nickel, tantalum, bismuth, lead, indium, tin, zinc, titanium and aluminum.

7. The liquid crystal display device according to claim 1, wherein at least one of the drain electrode, the source electrode, and the projection contains one selected from the group consisting of gold, silver, copper, tungsten, and aluminum.

8. The liquid crystal display device according to claim 1, wherein the liquid crystal display device is selected from the group consisting of a display device, a video camera, a digital camera, a goggle type display (head mounted display), a navigation system, an audio reproducing device, a laptop computer, a game machine, a portable information terminal and an image reproducing device.

9. The liquid crystal display device according to claim 1, wherein the plurality of conductors are formed from the same material.

10. A liquid crystal display device comprising:
a pixel portion comprising:
a base film comprising a photocatalyst formed over a substrate;
a thin film transistor formed over the base film;
a first projection comprising a conductive material formed over at least one of a drain electrode and a source electrode of the thin film transistor;
an interlayer insulating film formed over the thin film transistor; and
a pixel electrode connected to the first projection;
a terminal portion comprising:
the base film comprising the photocatalyst formed over the substrate;
a first wiring formed over the base film;
a first insulating film formed over the first wiring;
a second wiring formed over the first insulating film;
a second projection comprising a conductive material formed over the second wiring;
a second insulating film formed over the second wiring; and
a terminal electrode connected to the second projection,
wherein the interlayer insulating film is interposed between the base film and the pixel electrode,
wherein each of the first projection and the second projection has a stacked structure, said first projection including a plurality of first conductors and said second projection including a plurality of second conductors; and
wherein each of the plurality of first conductors is in direct contact with the interlayer insulating film and each of the plurality of second conductors is in direct contact with the second insulating film.

11. The liquid crystal display device according to claim 10, wherein each of the first projection and the second projection has a tapered shape.

12. The liquid crystal display device according to claim 10, wherein a part of a surface of the base film has a hydrophilic property.

13. The liquid crystal display device according to claim 10, wherein the base film contains one selected from the group consisting of titanium oxide, strontium titanate, cadmium selenide, potassium tantalate, cadmium sulfide, zirconium oxide, niobium oxide, zinc oxide, iron oxide, tungsten oxide.

14. The liquid crystal display device according to claim 10, wherein the base film is doped with a transition metal.

15. The liquid crystal display device according to claim 10, wherein at least one of a gate electrode of the thin film transistor and the first wiring contains one selected from the group consisting of gold, silver, copper, platinum, palladium, tungsten, nickel, tantalum, bismuth, lead, indium, tin, zinc, titanium, and aluminum.

16. The liquid crystal display device according to claim 10, wherein at least one of the drain electrode, the source electrode, the second wiring, the first projection and the second projection contains one selected from the group consisting of gold, silver, copper, tungsten, and aluminum.

17. The liquid crystal display device according to claim 10, wherein a conductor is formed over the first wiring, and wherein the conductor is connected to the first wiring and the second wiring.

18. The liquid crystal display device according to claim 17, wherein the conductor contains one selected from the group consisting of gold, silver, copper, tungsten, and aluminum.

19. The liquid crystal display device according to claim 10, wherein the liquid crystal display device is selected from the group consisting of a display device, a video camera, a digital camera, a goggle type display (head mounted display), a navigation system, an audio reproducing device, a laptop computer, a game machine, a portable information terminal and an Image reproducing device.

20. The liquid crystal display device according to claim 10, wherein the plurality of first conductors are formed from the same material.

* * * * *